(12) United States Patent
Park et al.

(10) Patent No.: US 10,181,461 B1
(45) Date of Patent: Jan. 15, 2019

(54) CAPACITOR AND BOARD HAVING THE SAME

(71) Applicant: SAMSUNG ELECTRO-MECHANICS CO., LTD., Suwon-si, Gyeonggi-do (KR)

(72) Inventors: No Il Park, Suwon-si (KR); In Young Kang, Suwon-si (KR); Hyun Ho Shin, Suwon-si (KR); Seung Mo Lim, Suwon-si (KR); Jeong Hoon Ryou, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/847,262

(22) Filed: Dec. 19, 2017

(30) Foreign Application Priority Data

Jul. 13, 2017 (KR) .......................... 10-2017-0088854

(51) Int. Cl.
*H05K 7/10* (2006.01)
*H05K 7/12* (2006.01)
(Continued)

(52) U.S. Cl.
CPC ............ *H01L 27/016* (2013.01); *H01L 25/16* (2013.01); *H01L 28/91* (2013.01); *H01L 21/0228* (2013.01); *H01L 21/02178* (2013.01); *H01L 21/02181* (2013.01); *H01L 21/02189* (2013.01); *H01L 21/28556* (2013.01); *H01L 23/66* (2013.01); *H01L 24/16* (2013.01);
(Continued)

(58) Field of Classification Search
USPC .......................... 361/767, 752, 808
See application file for complete search history.

(56) References Cited

U.S. PATENT DOCUMENTS 8,350,306 B2 *  1/2013  Sato ..................... H01G 4/228
                                                       257/295
2010/0213572 A1  8/2010  Ching et al.
(Continued)

FOREIGN PATENT DOCUMENTS

JP      2013-229582 A    11/2013
KR      10-1204579 B1    11/2012
KR      10-2014-0126081 A  10/2014

*Primary Examiner* — Andargie M Aychillhum
(74) *Attorney, Agent, or Firm* — McDermott Will & Emery LLP

(57) ABSTRACT

A capacitor includes a body including a substrate having first and second capacitor regions, and first to third terminal electrodes disposed on an external surface of the body. The first capacitor region includes a plurality of first trenches, and a first capacitor layer disposed on one surface of the substrate and in the first trenches in the first capacitor region and including at least one first dielectric layer and first and second electrodes disposed with the at least one first dielectric layer interposed therebetween. The second capacitor region includes a plurality of second trenches, and a second capacitor layer disposed on one surface of the substrate and the second trenches in the second capacitor region and including at least one second dielectric layer and third and fourth electrodes disposed with the at least one second dielectric layer interposed therebetween. The second capacitor layer has a specific surface area greater than that of the first capacitor layer.

11 Claims, 22 Drawing Sheets

(51) Int. Cl.
  *H01L 27/01*    (2006.01)
  *H01L 25/16*    (2006.01)
  *H01L 49/02*    (2006.01)
  *H01L 21/02*    (2006.01)
  *H01L 23/00*    (2006.01)
  *H01L 23/66*    (2006.01)
  *H01L 21/285*   (2006.01)
(52) U.S. Cl.
  CPC .................. *H01L 2223/6666* (2013.01); *H01L 2224/16225* (2013.01); *H01L 2924/19011* (2013.01); *H01L 2924/19041* (2013.01); *H01L 2924/19106* (2013.01)

(56) References Cited

U.S. PATENT DOCUMENTS

| | | |
|---|---|---|
| 2013/0258545 A1 | 10/2013 | Yano et al. |
| 2014/0311788 A1 | 10/2014 | Park et al. |
| 2015/0305159 A1* | 10/2015 | Yamamoto ............... H01G 4/40 361/767 |

\* cited by examiner

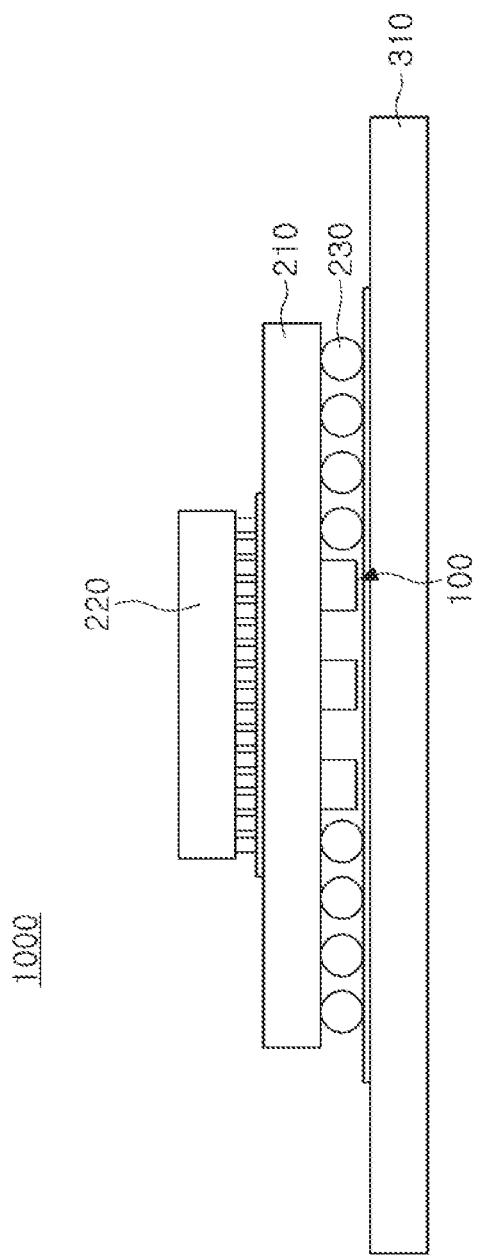

CAPACITOR AND BOARD HAVING THE SAME

CROSS-REFERENCE TO RELATED APPLICATION(S)

This application claims the benefit of priority to Korean Patent Application No. 10-2017-0088854 filed on Jul. 13, 2017 in the Korean Intellectual Property Office, the disclosure of which is incorporated herein by reference in its entirety.

TECHNICAL FIELD

The present disclosure relates to a capacitor and a board having the same.

BACKGROUND

In accordance with the recent trend for thinness, slimness, and lightness of next-generation application processors (AP) or power management integrated circuits (PMIC) mounted in recent smartphones, the necessity for a multilayer thin film capacitor having a thinner thickness than that of a general multilayer ceramic capacitor (MLCC) has increased. Particularly, as main mounting devices use a high frequency band, a capacitor implementing slimness and lightness has been required as a decoupling capacitor reducing noise generated in the mounting devices. However, since it may be difficult to satisfy this requirement in a general multilayer capacitor, demand for a multilayer capacitor having slimness and lightness implemented therein is expected to continuously increase. It is expected that this demand will result in the development of land-side capacitor (LSC) type multilayer thin film capacitor used as a decoupling capacitor for controlling power ripples caused by repetition of driving operations of devices due to a high frequency.

In a case of a multilayer thin film capacitor according to the related art, as the development of a multilayer thin film capacitor has increased, a thin film condenser for improving electrical connection stability between an internal electrode layer and a connection electrode in order to improve connection reliability of the thin film condenser has been disclosed. However, the thin film condenser does not provide additional functions except for functions provided by the thin film condenser according to the related art.

SUMMARY

An aspect of the present disclosure may provide a multilayer thin film capacitor capable of implementing capacitance flexibility in a multilayer thin film capacitor composed of a single chip in addition to functions exhibited by a thin film condenser according to the related art.

According to an aspect of the present disclosure, a capacitor may include a body including a substrate having first and second capacitor regions, and first to third terminal electrodes disposed on an external surface of the body. The first capacitor region includes a plurality of first trenches, and a first capacitor layer disposed on one surface of the substrate and in the first trenches in the first capacitor region. The first capacitor layer includes at least one first dielectric layer and first and second electrodes disposed with the at least one first dielectric layer interposed therebetween. The second capacitor region includes a plurality of second trenches, a second capacitor layer disposed on one surface of the substrate and the second trenches in the second capacitor region. The second capacitor layer includes at least one second dielectric layer and third and fourth electrodes disposed with the at least one second dielectric layer interposed therebetween. The second capacitor layer has a specific surface area greater than that of the first capacitor layer.

According to another aspect of the present disclosure, a board having a capacitor may include a circuit board having one surface on which a semiconductor chip is disposed, and a capacitor disposed on the other surface of the circuit board, corresponding to a mounting surface. The capacitor includes a body including a substrate having first and second capacitor regions, and first to third terminal electrodes disposed on an external surface of the body. The first capacitor region includes a plurality of first trenches, and a first capacitor layer disposed on one surface of the substrate and in the first trenches in the first capacitor region. The first capacitor layer includes at least one first dielectric layer and first and second electrodes disposed with the at least one first dielectric layer interposed therebetween. The second capacitor region includes a plurality of second trenches, and a second capacitor layer disposed on one surface of the substrate and the second trenches in the second capacitor region. The second capacitor layer includes at least one second dielectric layer and third and fourth electrodes disposed with the at least one second dielectric layer interposed therebetween. The second capacitor layer having a specific surface area greater than that of the first capacitor layer.

BRIEF DESCRIPTION OF DRAWINGS

The above and other aspects, features, and advantages of the present disclosure will be more clearly understood from the following detailed description taken in conjunction with the accompanying drawings, in which:

FIG. 22 is a cross-sectional view schematically illustrating a board having a capacitor according to another exemplary embodiment in the present disclosure.

DETAILED DESCRIPTION

Figure 1:
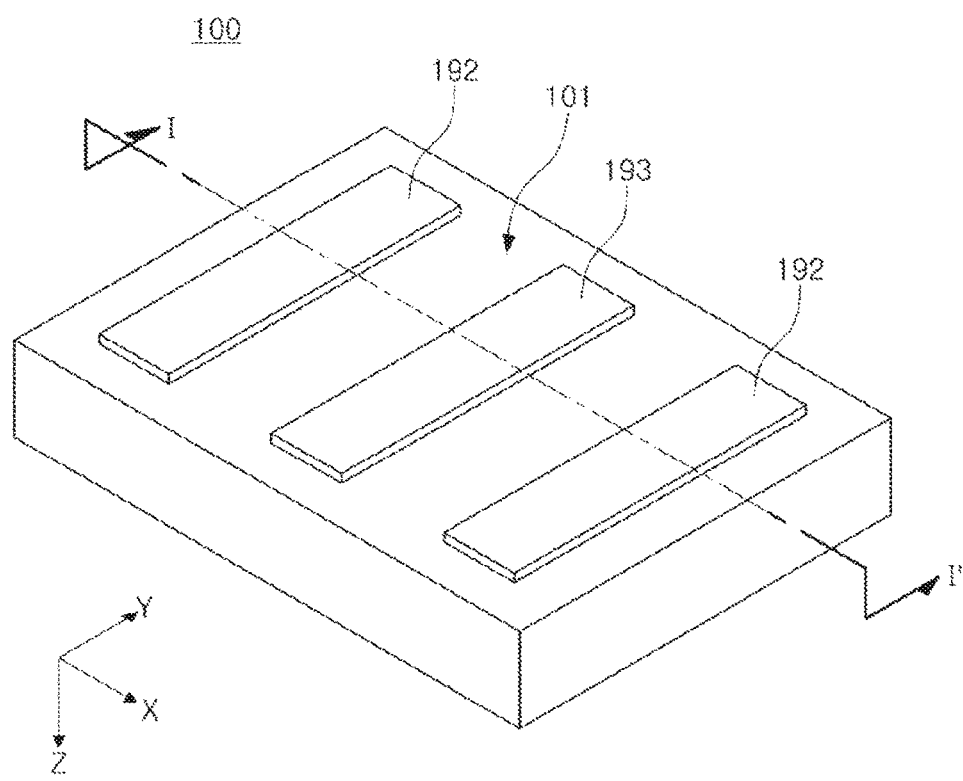
FIG. 1 is a perspective view schematically illustrating a capacitor according to an embodiment in the present disclosure.

Hereinafter, exemplary embodiments of the present disclosure will now be described in detail with reference to the accompanying drawings. In the accompanying drawings, shapes, sizes and the like, of the components may be exaggerated or shortened for clarity.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being 'on,' 'connected to,' or 'coupled to' another element, it can be directly 'on,' 'connected to,' or 'coupled to' the other element or other elements intervening therebetween may be present. In contrast, when an element is referred to as being 'directly on,' 'directly connected to,' or 'directly coupled to' another element, there may be no other elements or layers intervening therebetween. Like numerals refer to like elements throughout. As used herein, the term 'and/or' includes any and all combinations of one or more of the associated listed items.

It will be apparent that although the terms first, second, third, etc. may be used herein to describe various members, components, regions, layers and/or sections, any such members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the embodiments.

Spatially relative terms, such as 'above,' 'upper,' 'below,' and 'lower' and the like, may be used herein for ease of description to describe one element's relationship relative to another element(s) as shown in the figures. It will be understood that spatially relative terms are intended to encompass different orientations of the device in use or operation, in addition to the orientation depicted in the figures. For example, if the device in the figures is turned over, elements described as 'above,' or 'upper' relative to other elements would then be oriented 'below,' or 'lower' relative to the other elements or features. Thus, the term 'above' can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms 'a,' 'an,' and 'the' are intended to include the plural forms as well, unless the context clearly indicates otherwise. It will be further understood that the terms 'comprises,' and/or 'comprising' when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted alone, in combination or in partial combination.

The contents of the present disclosure described below may have a variety of configurations and propose only a required configuration herein, but are not limited thereto.

X, Y, and Z directions illustrated in the accompanying drawings may refer to length, width, and thickness directions, respectively.

Capacitor

Figure 2:
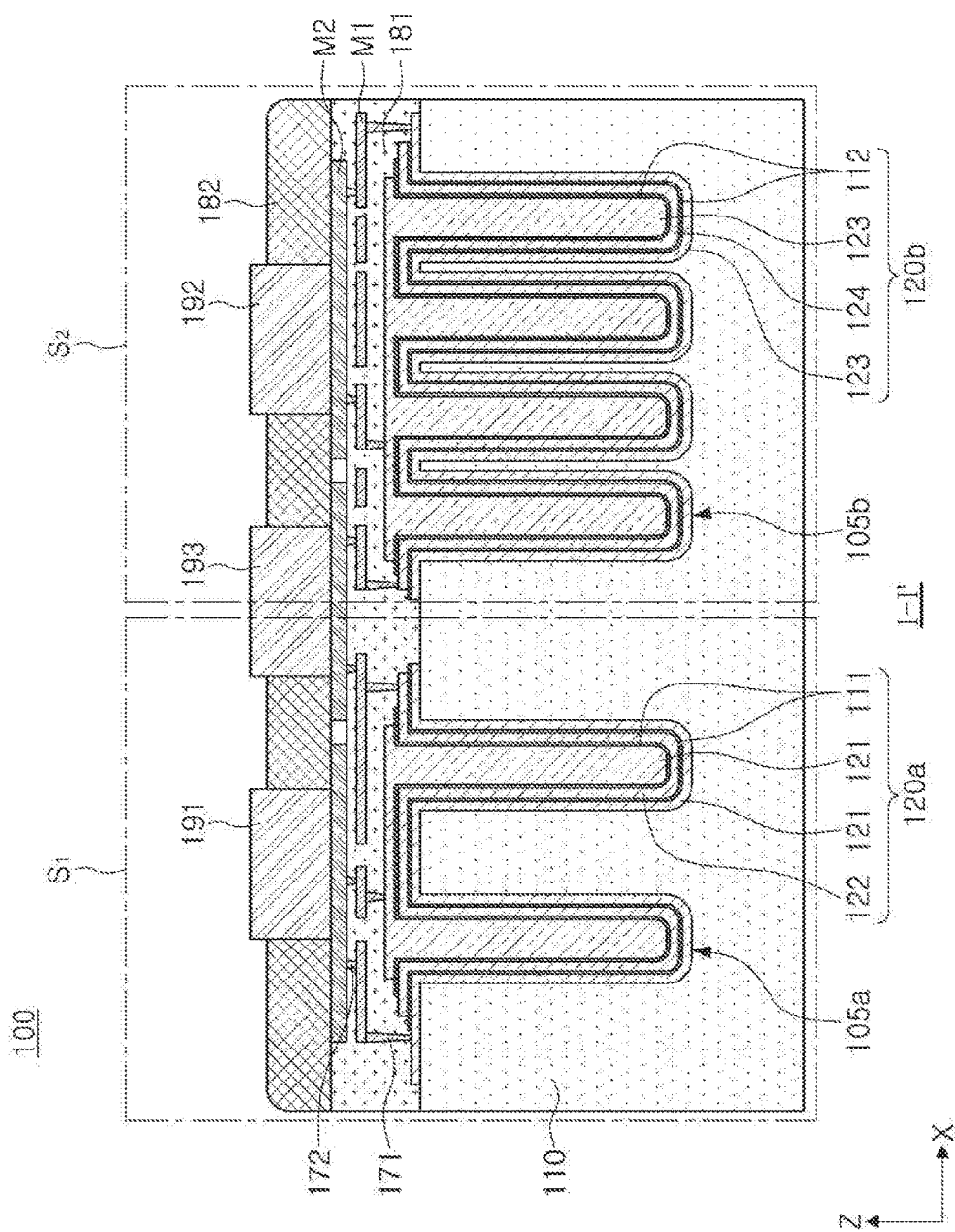
FIG. 2 is a cross-sectional view schematically illustrating the capacitor according to an embodiment in the present disclosure, taken along line I-I' of FIG. 1.

FIG. 1 is a perspective view schematically illustrating a capacitor 100 according to an embodiment in the present disclosure, and FIG. 2 is a cross-sectional view schematically the capacitor 100 according to an embodiment in the present disclosure, taken along line I-I' of FIG. 1.

A structure of the capacitor according to the present disclosure will be described with reference to FIGS. 1 and 2.

The capacitor 100 includes a body 101 and first to third terminal electrodes 191 to 193 disposed on an external surface of the body 101.

A shape of the body 101 is not particularly limited, but generally, may be a hexahedral shape. Further, the body 101 is not particularly limited in view of a dimension, but may have, for example, a size of 0.6 mm×0.3 mm or 1.0 mm×0.5 mm.

The body 101 includes a substrate 110. The substrate 110 may be formed of any one selected from the group consisting of Si, $SiO_2$, $Al_2O_3$, MgO, $LaAlO_3$, and $SrTiO_3$, or a combination thereof.

The substrate 110 may be composed of a first capacitor region $S_1$ and a second capacitor region $S_2$.

A plurality of first trenches 105a is disposed in the first capacitor region $S_1$. The first trench 105a is a portion penetrating from one surface of the substrate 110 in the first capacitor region $S_1$ to an interior of the substrate 110 in a depth (Z) direction to a predetermined depth.

A first capacitor layer 120a is disposed on the first trench 105a and the first capacitor region $S_1$.

The first capacitor layer 120a includes a first dielectric layer 111 and first and second electrodes 121 and 122 alternately disposed with the first dielectric layer 111 interposed therebetween.

The first and second electrodes 121 and 122 may be formed of a conductive material. A material of the first and second electrodes 121 and 122 may be determined depending on a material of the first dielectric layer 111. In a case in which the first dielectric layer 111 is formed of a paraelectric material such as a metal oxide, or the like, the material of the first and second electrodes 121 and 122 may include a metal nitride. For example, the first and second electrodes 121 and 122 may be formed of TiN, but are not limited thereto.

The first and second electrodes 121 and 122 may be formed using an atomic layer deposition (ALD) method or an atomic vapor deposition (AVD) method, but are not limited thereto. The first and second electrodes 121 and 122 may have a thickness of 100 nm or less.

The first dielectric layer 111 may be formed of the paraelectric material such as the metal oxide, or the like. The first dielectric layer 111 may contain any one of the metal oxides such as $Al_2O_3$, $ZrO_2$, $HfO_2$, and the like, or a combination thereof. The first dielectric layer 111 may contain and be formed of the metal oxide such as $Al_2O_3$, $ZrO_2$, $HfO_2$, or the like, as a single material. In an embodiment, the first dielectric layer 111 may be formed of a composite layer in order to improve electrical leakage properties. In a case in which the first dielectric layer 111 is formed of the composite layer, the first dielectric layer 111 may be a $ZrO_2$—$Al_2O_3$—$ZrO_2$ composite layer. The first dielectric layer 111 may have a thickness of about 50 nm or less.

The first dielectric layer 111 may be formed using an atomic layer deposition (ALD) method or an atomic vapor deposition (AVD) method, but is not limited thereto.

The first and second electrodes 121 and 122 are disposed to face each other with the first dielectric layer 111 interposed therebetween, such that the first capacitor layer 120*a* may operate as a capacitor when voltages having different polarities are applied to the first and second electrodes 121 and 122, respectively.

That is, the first and second electrodes 121 and 122 may be alternately disposed with the first dielectric layer 111 interposed therebetween, such that the first capacitor layer 120*a* having a metal-insulator-metal (MIM) structure may be formed.

A plurality of second trenches 105*b* is disposed in the second capacitor region $S_2$. The second trench 105*b* is a portion penetrating from one surface of the substrate 110 in the second capacitor region $S_2$ to the interior of the substrate 110 in the depth (Z) direction to a predetermined depth.

A second capacitor layer 120*b* is disposed on the second trench 105*b* and the second capacitor region $S_2$.

The second capacitor layer 120*b* includes a second dielectric layer 112 and third and fourth electrodes 123 and 124 alternately disposed with the second dielectric layer 112 interposed therebetween.

The third and fourth electrodes 123 and 124 may be formed of a conductive material. A material of the third and fourth electrodes 123 and 124 may be determined depending on a material used in the second dielectric layer 112. In a case in which the second dielectric layer 112 is formed of a paraelectric material such as a metal oxide, or the like, the material of the third and fourth electrodes 123 and 124 may include a metal nitride. For example, the third and fourth electrodes 123 and 124 may be formed of TiN, but are not limited thereto.

The third and fourth electrodes 123 and 124 may be formed using an atomic layer deposition (ALD) method or an atomic vapor deposition (AVD) method, but are not limited thereto. The third and fourth electrodes 123 and 124 may have a thickness of 100 nm or less.

The second dielectric layer 112 may be formed of the paraelectric material such as the metal oxide, or the like. The second dielectric layer 112 may contain any one of the metal oxides such as $Al_2O_3$, $ZrO_2$, $HfO_2$, and the like, or a combination thereof. The second dielectric layer 112 may contain and be formed of the metal oxide such as $Al_2O_3$, $ZrO_2$, $HfO_2$, or the like, as a single material. In an embodiment, the second dielectric layer 112 may be formed of a composite layer in order to improve electrical leakage properties. In a case in which the second dielectric layer 112 is formed of the composite layer, the second dielectric layer 112 may be a $ZrO_2$—$Al_2O_3$—$ZrO_2$ composite layer. The second dielectric layer 112 may have a thickness of about 50 nm or less.

The second dielectric layer 112 may be formed using an atomic layer deposition (ALD) method or an atomic vapor deposition (AVD) method, but is not limited thereto.

The third and fourth electrodes 123 and 124 may be disposed to face each other with the second dielectric layer 112 interposed therebetween, such that the second capacitor layer 120*b* may operate as a capacitor when voltages having different polarities are applied to the third and fourth electrodes 123 and 124, respectively.

That is, the third and fourth electrodes 123 and 124 may be alternately disposed with the second dielectric layer 112 interposed therebetween, such that the second capacitor layer 120*b* having a metal-insulator-metal (MIM) structure may be formed.

Figure 3:
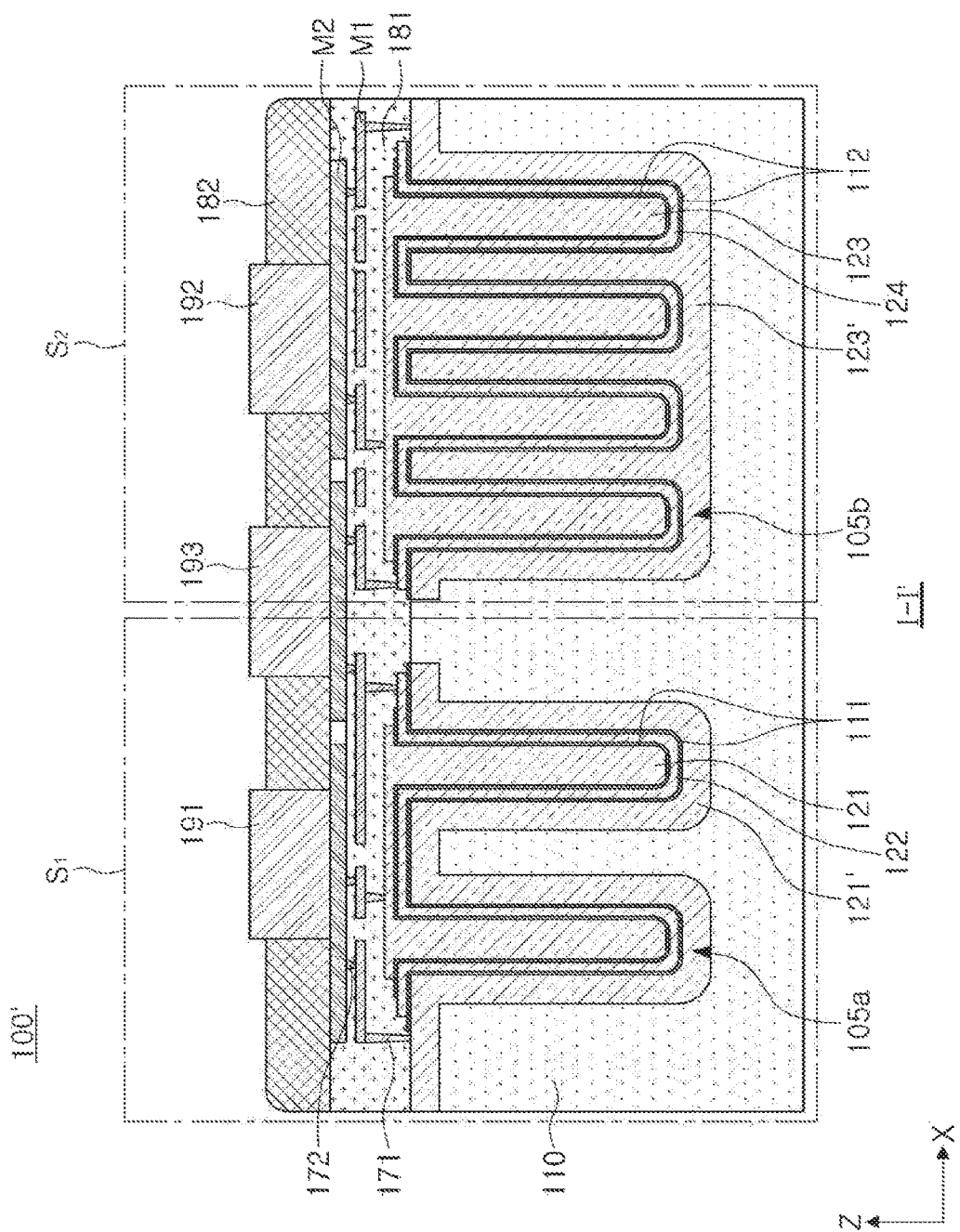
FIG. 3, which is a cross-sectional view taken along line I-I' of FIG. 1, is a cross-sectional view schematically illustrating a capacitor according to an embodiment in the present disclosure in which an electrode positioned at a lowermost portion is a doped layer.

In an embodiment, referring to a capacitor 100' illustrated in FIG. 3, among first to fourth electrodes 121 to 124, electrodes disposed at a lowermost layer may be doped layers 121' and 123' formed by injecting n-type impurities into a substrate 110.

A first insulating layer 181 is disposed on the first and second capacitor layers 120*a* and 120*b* to cover the first and second capacitor layers 120*a* and 120*b*. The insulating layer 181 may be formed of silicon oxide ($SiO_2$), but is not limited thereto.

The first insulating layer 181 includes first and second connection electrode layers M1 and M2. The first and second connection electrode layers M1 and M2 may be formed using a conductive material. For example, the first and second connection electrode layers M1 and M2 may be formed using a metal nitride such as TiN.

The first and second connection electrode layers M1 and M2 connect each of the first to fourth electrodes 121 to 124 to one of first to third terminal electrodes 191 to 193.

The first electrode 121 is connected to the first connection electrode layer M1 electrically connected to the first terminal electrode 191 through a first conductive via 171. The first connection electrode layer M1 connected to the first electrode 121 is connected to the second connection electrode layer M2 electrically connected to the first terminal electrode 191 through a second conductive via 172.

The second electrode 122 is connected to the first connection electrode layer M1 electrically connected to the third terminal electrode 193 through the first conductive via 171. The first connection electrode layer M1 connected to the second electrode 122 is connected to the second connection electrode layer M2 electrically connected to the third terminal electrode 193 through the second conductive via 172.

The third electrode 123 is connected to the first connection electrode layer M1 electrically connected to the second terminal electrode 192 through the first conductive via 171. The first connection electrode layer M1 connected to the third electrode 123 is connected to the second connection electrode layer M2 electrically connected to the second terminal electrode 192 through the second conductive via 172.

The fourth electrode 124 is connected to the first connection electrode layer M1 electrically connected to the third terminal electrode 193 through the first conductive via 171. The first connection electrode layer M1 connected to the fourth electrode 124 is connected to the second connection electrode layer M2 electrically connected to the third terminal electrode 193 through the second conductive via 172.

That is, the first electrode 121 is connected to the first terminal electrode 191, the second and fourth electrodes 122 and 124 are connected to the third terminal electrode 193, and the third electrode 123 is connected to the second terminal electrode 192.

Therefore, capacitance of the capacitor 100 according to an embodiment in the present disclosure may be changed, depending on which electrode is selected from the first to third terminal electrodes 191 to 193 by a user.

Each of the first to third terminal electrodes 191 to 193 may be disposed on the first insulating layer 181 to come into contact with the second connection electrode layer M2. The first to third terminal electrodes 191 to 193 may be formed by forming seed layers using Ti/W, Ti/Cu, Ti/Al, or the like, and forming plating layers on the seed layers using Au, Cu, Sn, or the like.

A second insulating layer 182 formed using a polymer such as epoxy is formed on the first insulating layer 181. The second insulating layer 182 may serve to insulate the first to third terminal electrodes 191 to 193 from one another between the first to third terminal electrodes 191 to 193.

Figure 5A:
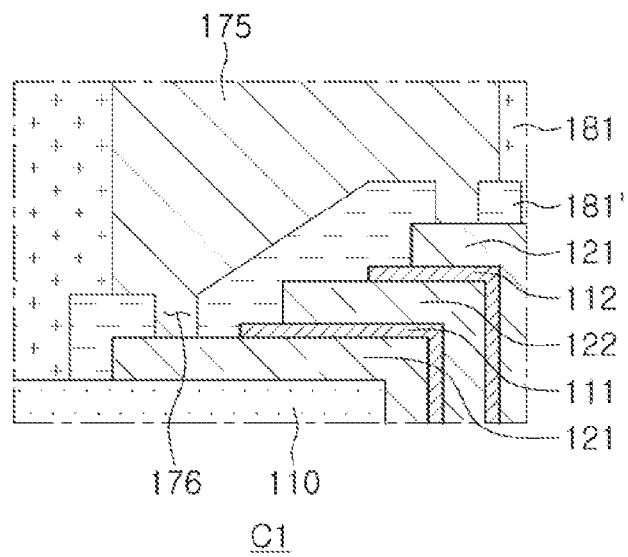
FIGS. 5A and 5B are enlarged cross-sectional views illustrating the lead portions.
Figure 5B:
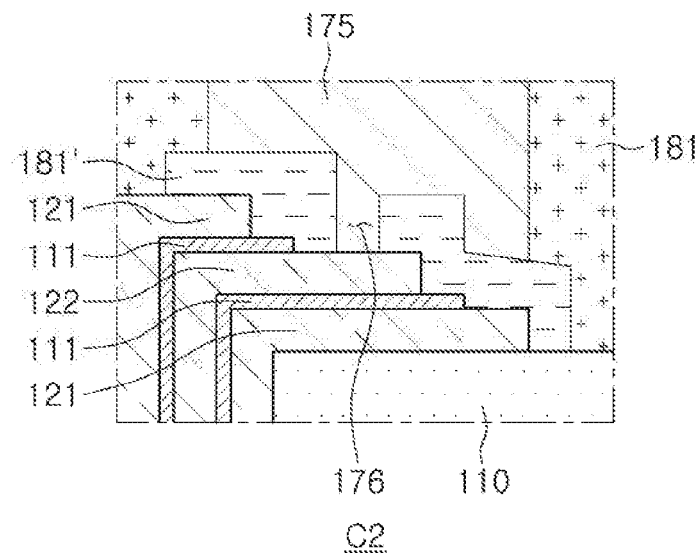
Figure 6A:
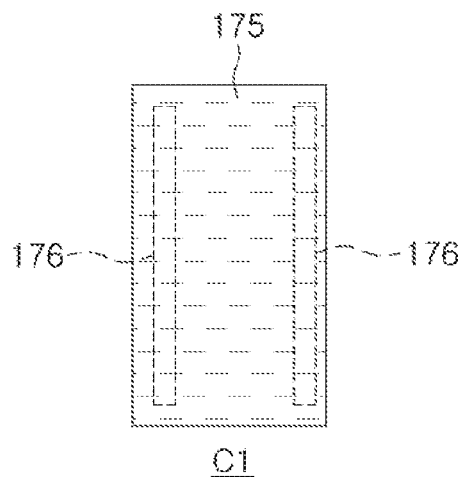
FIGS. 6A and 6B are enlarged plan views illustrating the lead portions.
Figure 6B:
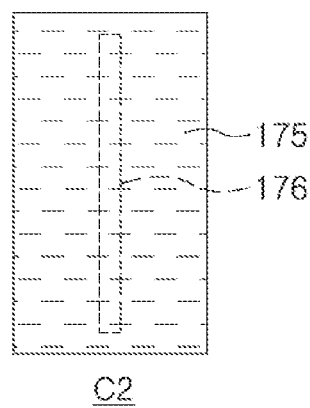

A method of connecting the first to fourth electrodes 121 to 124 and the first to third terminal electrodes 191 to 193 is not limited to the method described above, but as illustrated in FIGS. 4 through 6, the first to fourth electrodes 121 to 124 and the first to third terminal electrodes 191 to 193 may also be connected to each other using lead portions having a step shape.

A method of connecting the first to fourth electrodes 121 to 124 and the first to third terminal electrodes 191 to 193 using the lead portions having a step shape will be described with reference to FIGS. 4 through 6B.

The first capacitor layer 120a includes first and second lead portions C1 and C2 declined outwardly from the first capacitor layer 120a and formed by stacking the first electrode 121, the first dielectric layer 111, and the second electrode 122.

The second capacitor layer 120b includes third and fourth lead portions C3 and C4 declined outwardly from the second capacitor layer 120b and formed by stacking the third electrode 123, the second dielectric layer 112, and the fourth electrode 124.

An insulating layer 181' is disposed on the first to fourth lead portions C1 to C4 to cover the first to fourth lead portions C1 to C4. The insulating layer 181' disposed on the first to fourth lead portions C1 to C4 may be formed of a polymer or $SiO_2$, but is not limited thereto.

Referring to FIGS. 5A through 6B, a first opening 176 is formed in the first insulating layer 181' disposed to cover the first lead portion C1. The first opening 176 is formed in a position corresponding to the first electrode 121 to be elongated in one direction. Further, a second opening 176 is formed in the insulating layer 181' disposed to cover the second lead portion C2. The second opening 176 is formed in a position corresponding to the second electrode 122 to be elongated in one direction.

The first and second openings 176 may be formed to be elongated in one direction, such that a contact between a conductive layer 175 and the first electrode 121 may be improved.

In the third lead portion C3, the first opening is formed in a position corresponding to the third electrode 123, similarly to the first lead portion C1. In the fourth lead portion C4, the second opening is formed in a position corresponding to the fourth electrode 124, similarly to the second lead portion C2.

The conductive layer 175 disposed to fill the first and second openings and connected to a connection electrode layer M1' may be disposed on the insulating layer 181'.

Figure 4:
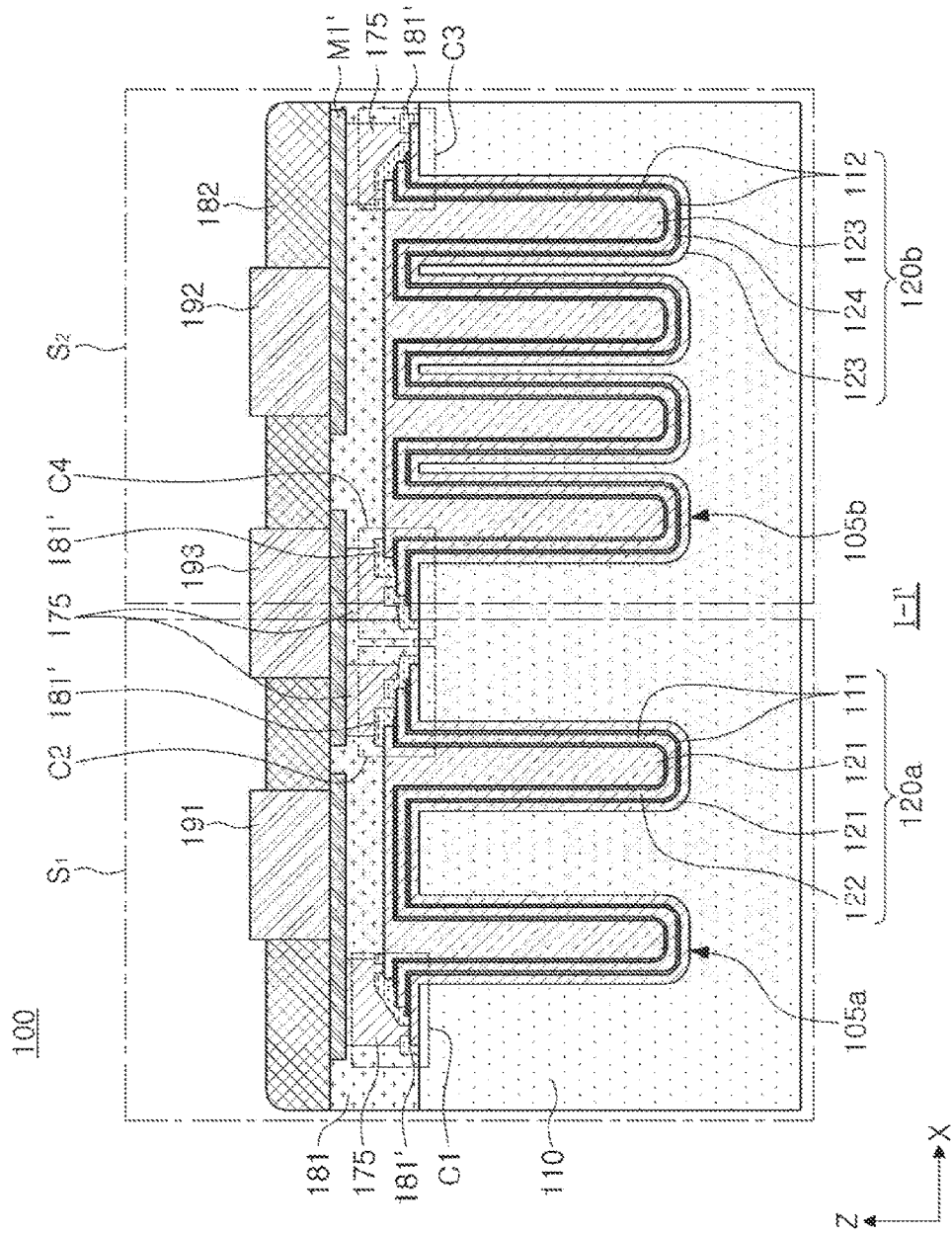
FIG. 4 is a cross-sectional view schematically illustrating a capacitor according to an embodiment in the present disclosure, having first and second capacitor layers including lead portions having a step shape.

As illustrated in FIG. 4, in a case of using the lead portions having the step shape, the first to fourth electrodes 121 to 124 and the first to third terminal electrodes 191 to 193 may be connected to each other using the connection electrode layer M1' formed of a single layer. That is, the capacitor may be thinned by decreasing the number of connection electrodes.

FIGS. 7 through 10 are plan views schematically illustrating various shapes of upper surfaces of first and second trenches according to the present disclosure.

Referring to FIGS. 7 through 10, it may be appreciated that a specific surface area of the second capacitor layer 120b of the second capacitor region $S_2$ is larger than that of the first capacitor layer 120a of the first capacitor region $S_1$. As referred to herein, the term "specific surface area" refers to the surface area of the capacitor layer per unit volume of the respective capacitor region. Thus, if the surface size and shape of the trenches are the same, for two regions of equal area, the region having more trenches has a higher specific surface area than the region having fewer trenches.

The specific surface areas of the first and second capacitor layers 120a and 120b as described above may be controlled by adjusting the numbers of first and second trenches 105a and 105b of the first and second capacitor regions $S_1$ and $S_2$. For example, the number of first trenches 105a disposed in the first capacitor region $S_1$ may be smaller than the number of second trenches 105b disposed in the second capacitor region $S_2$.

Referring to FIG. 2, in the capacitor 100 according to an embodiment in the present disclosure, when three terminal electrodes 191 to 193 are all connected to an electronic device, both of the first and second capacitor layers 120a and 120b may implement capacitance, thereby implementing maximum capacitance of the capacitor 100. In an embodiment, when small capacitance is required depending on a situation, only the first and third terminal electrodes 191 and 193 may be activated, or only the second and third terminal electrodes 192 and 193 may also be activated. Therefore, the capacitor 100 according to an embodiment in the present disclosure has an advantage in that capacitance flexibility may be implemented without additionally using a capacitor having different capacitance.

For example, when the first and second trenches 105a and 105b are formed so that the specific surface areas of the first and second capacitor layers 120a and 120b are equal to each other, in a case of activating all the first to third terminal electrodes 191 to 193, the capacitor 100 may have maximum capacitance, and in a case of activating only the first and third terminal electrodes 191 and 193, the capacitor 100 may have capacitance corresponding to 50% of the maximum capacitance. That is, the capacitor 100 according to an embodiment in the present disclosure may implement at least two kinds of capacitance by selectively activating some or all of the three terminal electrodes.

Further, in a case in which the specific surface areas of the first and second capacitor layers 120a and 120b are different from each other, the capacitor 100 may implement three kinds of capacitance by selectively activating some or all of the three terminal electrodes.

For example, in a case in which capacitance of the first capacitor region $S_1$ is 70 nF, and capacitance of the second capacitor region $S_2$ is 130 nF, when the first to third terminal electrodes 191 to 193 are all activated, capacitance of 200 nF corresponding to maximum capacitance may be obtained. However, when only the first and third terminal electrodes 191 and 193 are activated, capacitance of 70 nF may be obtained, and when only the second and third terminal electrodes 192 and 193 are activated, capacitance of 130 nF may be obtained.

That is, the capacitor 100 according to an embodiment in the present disclosure may use the first and second trenches 105a and 105b, such that capacitance of the capacitor may be significantly increased as compared to the related art, and at the same time, the capacitor 100 may have capacitance flexibility capable of adjusting capacitance by selection of a user.

Figure 7:
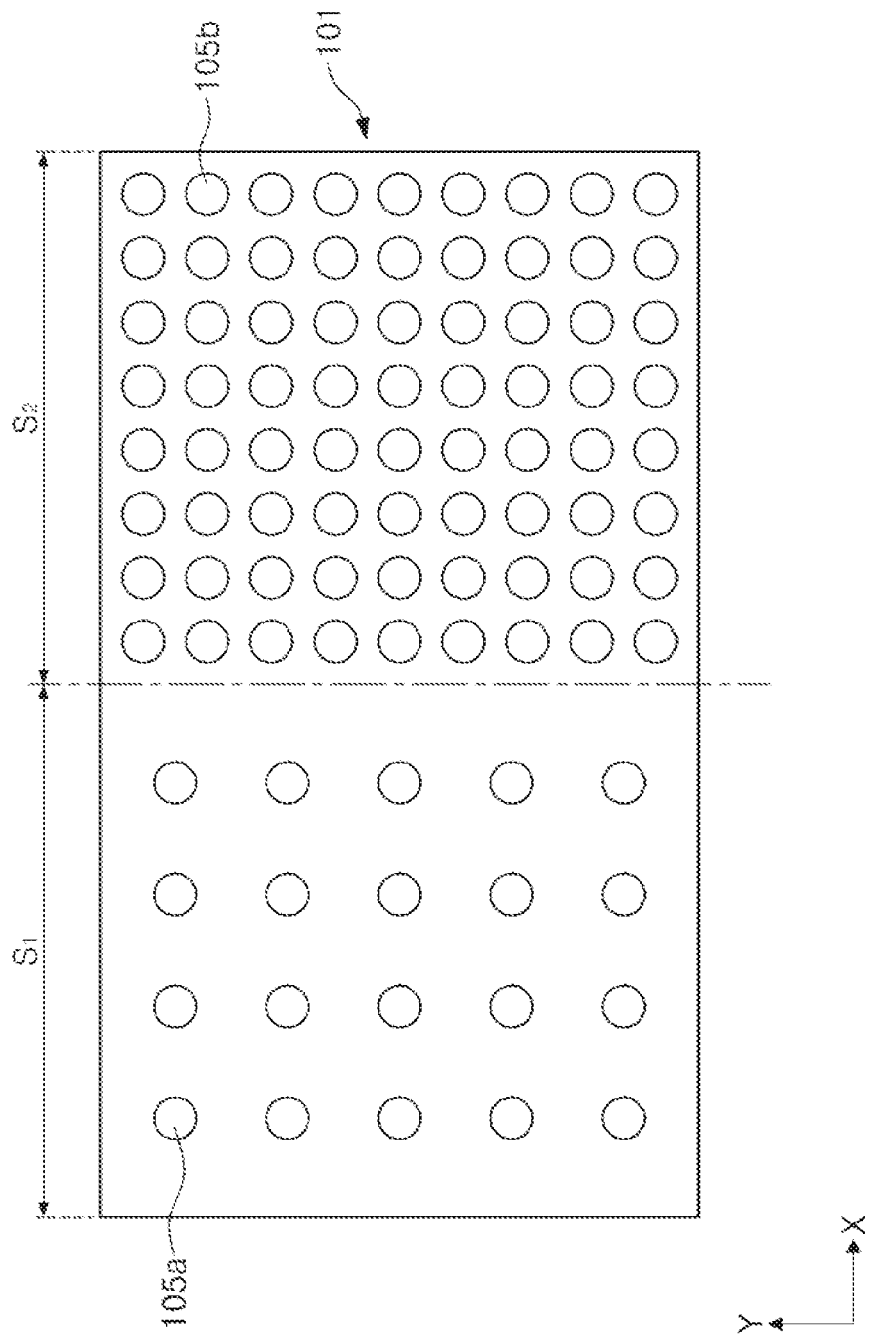
FIGS. 7 through 10 are plan views schematically illustrating various shapes of upper surfaces of first and second trenches according to the present disclosure.

Referring to FIG. 7, in the capacitor 100 according to an embodiment in the present disclosure, the first and second capacitor regions $S_1$ and $S_2$ may be disposed in a first (X)

direction. Here, it may be appreciated that the number of first trenches 105a disposed in the first capacitor region $S_1$ per unit area is smaller than the number of second trenches 105b disposed in the second capacitor region $S_2$ per unit area. The upper surfaces of first and second trenches 105a and 105b may have a circular shape, but are not limited thereto. Further, widths (or diameters) of the upper surfaces of the first and second trenches 105a and 105b may be equal to each other. Here, the term "equal" may mean "substantially equal" in consideration of a manufacturing error.

Since the number of first trenches 105a disposed in the first capacitor region $S_1$ is smaller than the number of second trenches 105b disposed in the second capacitor region $S_2$, a specific surface area of the first capacitor layer 120a disposed in the first capacitor region $S_1$ may be smaller than that of the second capacitor layer 120b disposed in the second capacitor region $S_2$. Therefore, capacitance implemented in the first capacitor layer 120a in the first capacitor region $S_1$ may be smaller than capacitance implemented in the second capacitor layer 120b in the second capacitor region $S_2$.

As a result, the capacitor 100 according to an embodiment in the present disclosure may implement three kinds of capacitance by selectively activating some or all of the three terminal electrodes.

Figure 8:
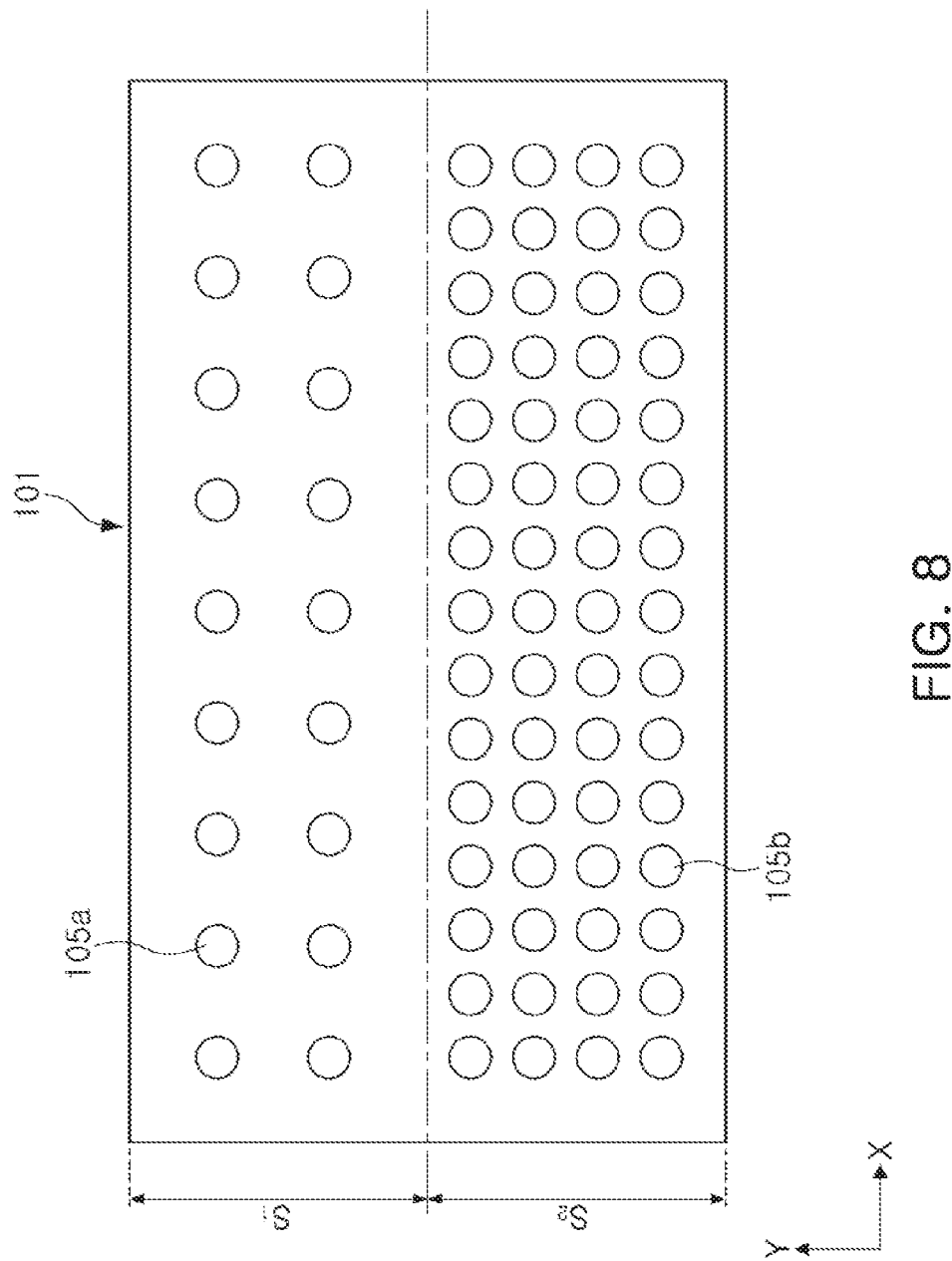

In FIG. 8, the first and second capacitor regions $S_1$ and $S_2$ may be disposed in a second (Y) direction perpendicular to the first (X) direction.

Figure 9:
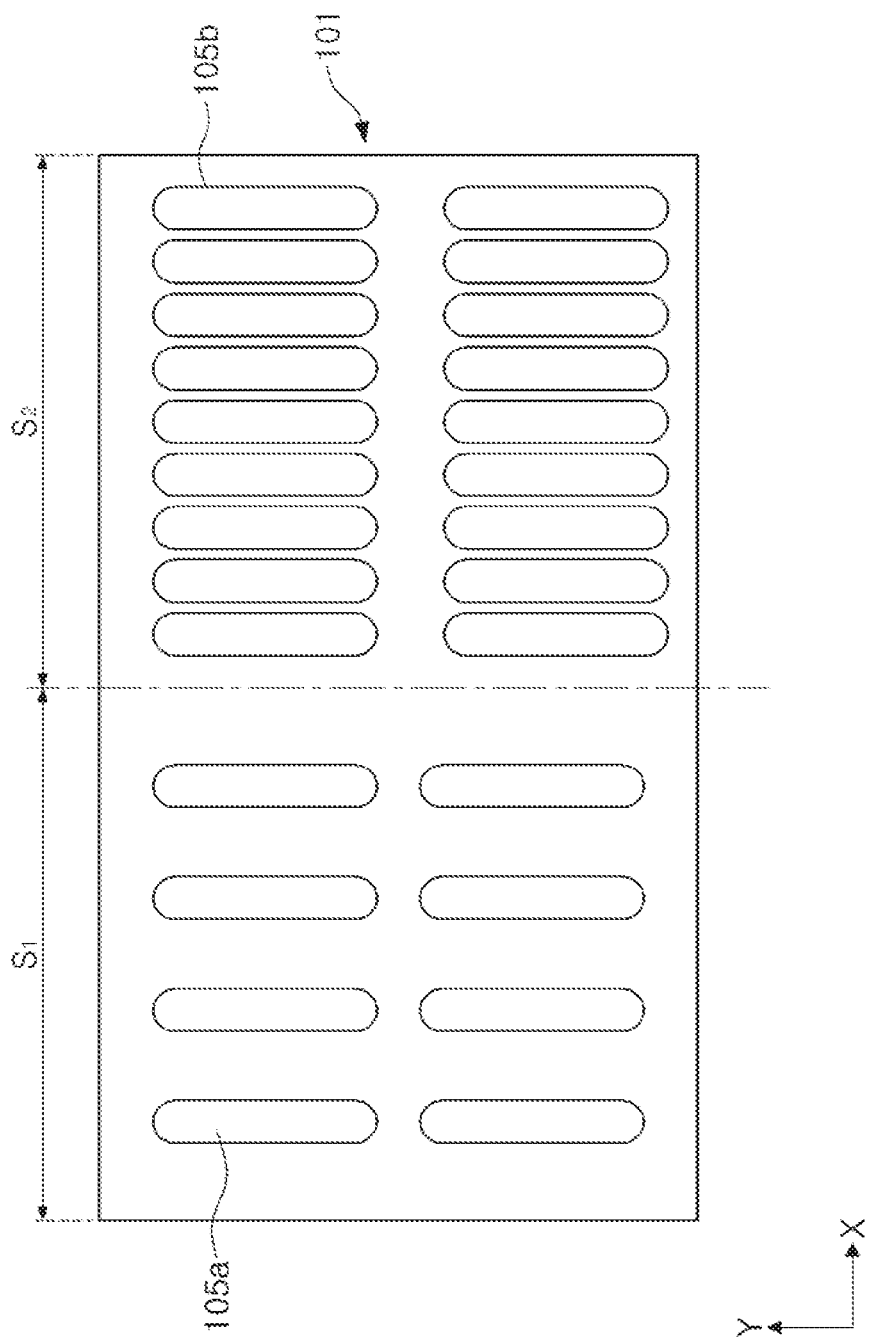
Figure 10:
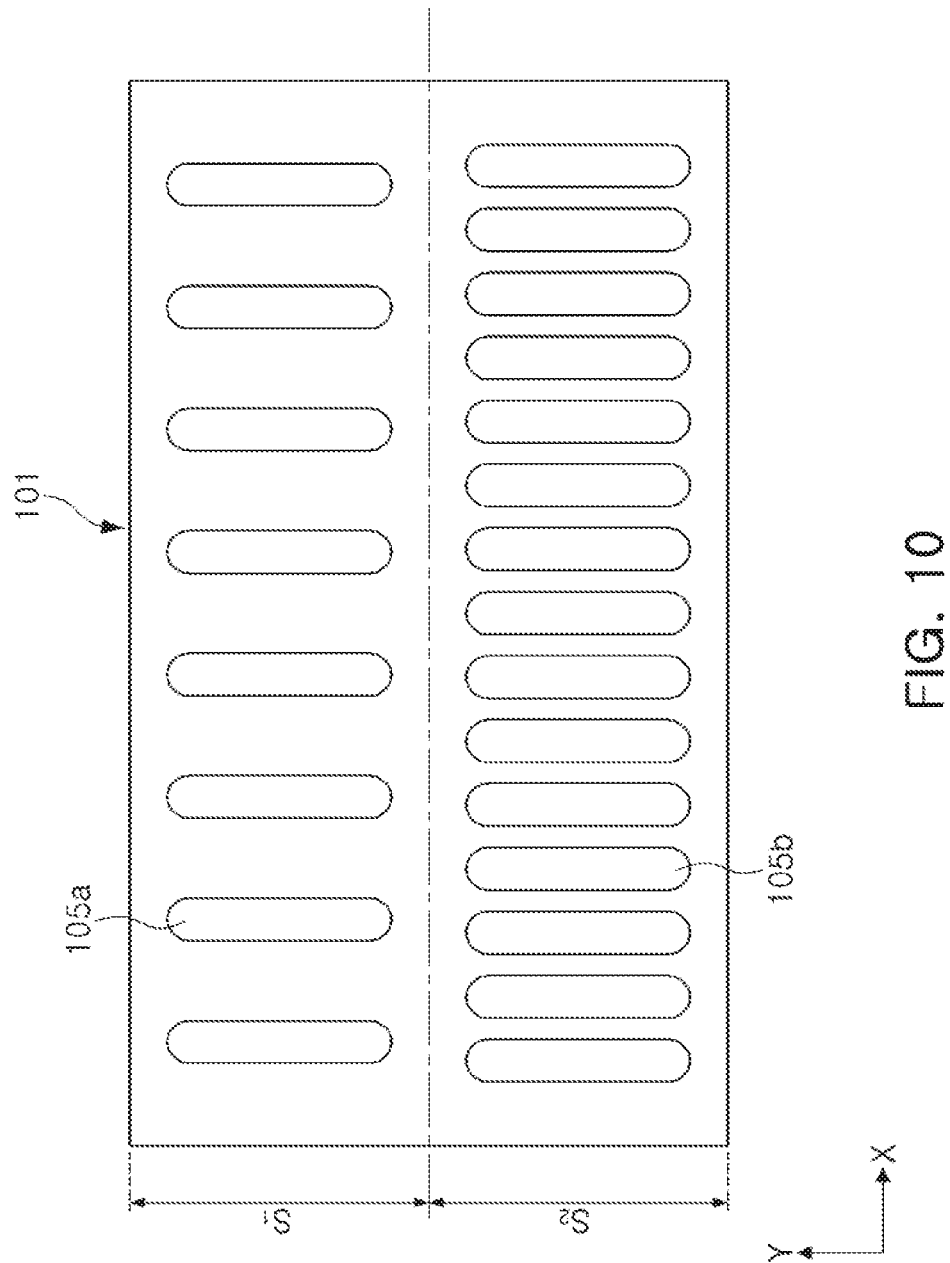

Further, referring to FIGS. 9 and 10, the first and second trenches 105a and 105b may be formed to be elongated in one direction in a groove shape. Although only linear groove shapes are illustrated in FIGS. 9 and 10, but the first and second trenches 105a and 105b may also be formed to have a curved groove shape.

Figure 11:
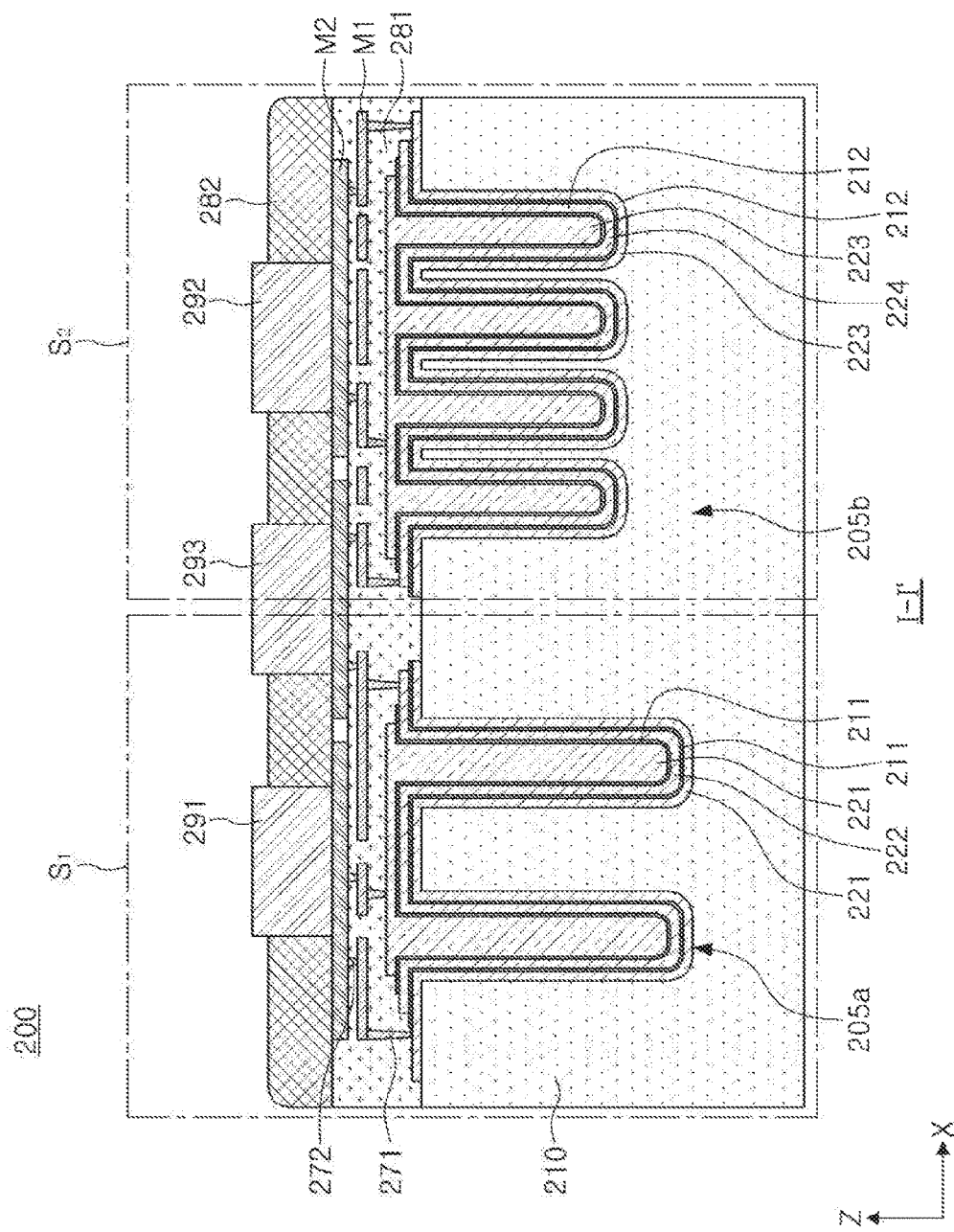
FIG. 11 is a cross-sectional view schematically illustrating a capacitor according to another exemplary embodiment in the present disclosure.

FIG. 11 is a cross-sectional view schematically illustrating a capacitor according to another exemplary embodiment in the present disclosure.

A capacitor 200 includes a body 201 and first to third terminal electrodes 291 to 293 disposed on an external surface of the body 201.

A shape of the body 201 is not particularly limited, but generally, may be a hexahedral shape. Further, the body 201 is not particularly limited in view of a dimension, but may have, for example, a size of 0.6 mm×0.3 mm or 1.0 mm×0.5 mm.

The body 201 includes a substrate 210. The substrate 210 may be formed of any one selected from the group consisting of Si, $SiO_2$, $Al_2O_3$, MgO, $LaAlO_3$, and $SrTiO_3$, or a combination thereof.

The substrate 210 is composed of a first capacitor region $S_1$ and a second capacitor region $S_2$.

A plurality of first trenches 205a is disposed in the first capacitor region $S_1$. The first trench 205a is a portion penetrating from one surface of the substrate 210 in the first capacitor region $S_1$ to an interior of the substrate 210 in a depth (Z) direction to a predetermined depth.

A first capacitor layer 120a is disposed on the first trench 205a and the first capacitor region $S_1$.

The first capacitor layer 120a includes a first dielectric layer 211 and first and second electrodes 221 and 222 alternately disposed with the first dielectric layer 211 interposed therebetween.

The first and second electrodes 221 and 222 may be formed of a conductive material. A material of the first and second electrodes 221 and 222 may be determined depending on a material of the first dielectric layer 211. In a case in which the first dielectric layer 211 is formed of a paraelectric material such as a metal oxide, or the like, the material of the first and second electrodes 221 and 222 may include a metal nitride. For example, the first and second electrodes 221 and 222 may be formed of TiN, but are not limited thereto.

The first and second electrodes 221 and 222 may be formed using an atomic layer deposition (ALD) method or an atomic vapor deposition (AVD) method, but are not limited thereto. The first and second electrodes 221 and 222 may have a thickness of 200 nm or less.

The first dielectric layer 211 may be formed of the paraelectric material such as the metal oxide, or the like. The first dielectric layer 211 may contain any one of the metal oxides such as $Al_2O_3$, $ZrO_2$, $HfO_2$, and the like, or a combination thereof. The first dielectric layer 211 may contain and be formed of the metal oxide such as $Al_2O_3$, $ZrO_2$, $HfO_2$, or the like, as a single material. In an embodiment, the first dielectric layer 211 may be formed of a composite layer in order to improve electrical leakage properties. In a case in which the first dielectric layer 211 is formed of the composite layer, the first dielectric layer 211 may be a $ZrO_2$—$Al_2O_3$—$ZrO_2$ composite layer. The first dielectric layer 211 may have a thickness of about 50 nm or less.

The first dielectric layer 211 may be formed using an atomic layer deposition (ALD) method or an atomic vapor deposition (AVD) method, but is not limited thereto.

The first and second electrodes 221 and 222 are disposed to face each other with the first dielectric layer 211 interposed therebetween, such that the first capacitor layer 120a may operate as a capacitor when voltages having different polarities are applied to the first and second electrodes 221 and 222, respectively.

That is, the first and second electrodes 221 and 222 may be alternately disposed with the first dielectric layer 211 interposed therebetween, such that the first capacitor layer 120a having a metal-insulator-metal (MIM) structure may be formed.

A plurality of second trenches 205b is disposed in the second capacitor region $S_2$. The second trench 205b is a portion penetrating from one surface of the substrate 210 in the second capacitor region $S_2$ to the interior of the substrate 210 in the depth (Z) direction to a predetermined depth.

A second capacitor layer 120b is disposed on the second trench 205b and the second capacitor region $S_2$.

The second capacitor layer 120b includes a second dielectric layer 212 and third and fourth electrodes 223 and 224 alternately disposed with the second dielectric layer 212 interposed therebetween.

The third and fourth electrodes 223 and 224 may be formed of a conductive material. A material of the third and fourth electrodes 223 and 224 may be determined depending on a material used in the second dielectric layer 212. In a case in which the second dielectric layer 212 is formed of a paraelectric material such as a metal oxide, or the like, the material of the third and fourth electrodes 223 and 224 may include a metal nitride. For example, the third and fourth electrodes 221 and 222 may be formed of TiN, but are not limited thereto.

The third and fourth electrodes 223 and 224 may be formed using an atomic layer deposition (ALD) method or an atomic vapor deposition (AVD) method, but are not limited thereto. The third and fourth electrodes 223 and 224 may have a thickness of 200 nm or less.

The second dielectric layer 212 may be formed of the paraelectric material such as the metal oxide, or the like. The second dielectric layer 212 may contain any one of the metal oxides such as $Al_2O_3$, $ZrO_2$, $HfO_2$, and the like, or a combination thereof. The second dielectric layer 212 may contain and be formed of the metal oxide such as $Al_2O_3$, $ZrO_2$, $HfO_2$, or the like, as a single material. In an embodiment, the second dielectric layer 212 may be formed of a composite layer in order to improve electrical leakage properties. In a case in which the second dielectric layer 212 is formed of the composite layer, the second dielectric layer 212 may be a $ZrO_2$—$Al_2O_3$—$ZrO_2$ composite layer. The second dielectric layer 212 may have a thickness of about 50 nm or less.

The second dielectric layer 212 may be formed using an atomic layer deposition (ALD) method or an atomic vapor deposition (AVD) method, but is not limited thereto.

The third and fourth electrodes 223 and 224 are disposed to face each other with the second dielectric layer 212 interposed therebetween, such that the second capacitor layer 120b may operate as a capacitor when voltages having different polarities are applied to the third and fourth electrodes 223 and 224, respectively.

That is, the third and fourth electrodes 223 and 224 may be alternately disposed with the second dielectric layer 212 interposed therebetween, such that the second capacitor layer 120b having a metal-insulator-metal (MIM) structure may be formed.

A first insulating layer 281 is disposed on the first and second capacitor layers 120a and 120b to cover the first and second capacitor layers 120a and 120b. The insulating layer 281 may be formed of silicon oxide ($SiO_2$), but is not limited thereto.

The first insulating layer 281 may include first and second connection electrode layers M1 and M2. The first and second connection electrode layers M1 and M2 may be formed using a conductive material. For example, the first and second connection electrode layers M1 and M2 may be formed using a metal nitride such as TiN.

The first and second connection electrode layers M1 and M2 connect each of the first to fourth electrodes 221 to 224 to one of first to third terminal electrodes 291 to 293.

The first electrode 221 is connected to the first connection electrode layer M1 electrically connected to the first terminal electrode 291 through a first conductive via 271. The first connection electrode layer M1 connected to the first electrode 221 is connected to the second connection electrode layer M2 electrically connected to the first terminal electrode 291 through a second conductive via 272.

The second electrode 222 is connected to the first connection electrode layer M1 electrically connected to the third terminal electrode 293 through the first conductive via 271. The first connection electrode layer M1 connected to the second electrode 222 is connected to the second connection electrode layer M2 electrically connected to the third terminal electrode 293 through the second conductive via 272.

The third electrode 223 is connected to the first connection electrode layer M1 electrically connected to the second terminal electrode 292 through the first conductive via 271. The first connection electrode layer M1 connected to the third electrode 223 is connected to the second connection electrode layer M2 electrically connected to the second terminal electrode 292 through the second conductive via 272.

The fourth electrode 224 is connected to the first connection electrode layer M1 electrically connected to the third terminal electrode 293 through the first conductive via 271. The first connection electrode layer M1 connected to the fourth electrode 224 is connected to the second connection electrode layer M2 electrically connected to the third terminal electrode 293 through the second conductive via 272.

That is, the first electrode 221 is connected to the first terminal electrode 291, the second and fourth electrodes 222 and 224 are connected to the third terminal electrode 293, and the third electrode 223 is connected to the second terminal electrode 292.

Therefore, capacitance of the capacitor 200 according to another exemplary embodiment in the present disclosure may be changed depending on which electrode is selected from the first to third terminal electrodes 291 to 293 by a user.

Each of the first to third terminal electrodes 291 to 293 is disposed on the first insulating layer 281 to come into contact with the second connection electrode layer M2. The first to third terminal electrodes 291 to 293 may be formed by forming seed layers using Ti/W, Ti/Cu, Ti/Al, or the like, and forming plating layers on the seed layers using Au, Cu, Sn, or the like.

A second insulating layer 282 formed using a polymer such as epoxy is formed on the first insulating layer 281. The second insulating layer 282 may serve to insulate the first to third terminal electrodes 291 to 293 from one another between the first to third terminal electrodes 291 to 293.

FIGS. 12 through 21 are plan views schematically illustrating various shapes of upper surfaces of first and second trenches according to the present disclosure.

Referring to FIGS. 12 through 21, it may be appreciated that a specific surface area of the second capacitor layer 220b of the second capacitor region $S_2$ is larger than that of the first capacitor layer 220a of the first capacitor region $S_1$.

Specific surface areas of the first and second capacitor layers 220a and 220b as described above may be controlled by adjusting widths or depths, that is, sizes of the first and second trenches 205a and 205b. In addition, the specific surface areas of the first and second capacitor layers 220a and 220b may be controlled by adjusting the numbers of the first and second trenches 205a and 205b per unit area.

For example, the width or depth of the first trench 205a disposed in the first capacitor region $S_1$ may be smaller than that of the second trench 205b disposed in the second capacitor region $S_2$. However, even in this case, the numbers of first and second trenches 205a and 205b per unit area may be adjusted so that the specific surface area of the second capacitor layer 220b of the second capacitor region $S_2$ is larger than that of the first capacitor layer 220a of the first capacitor region $S_1$.

Generally, a trench may be formed by etching one surface of a substrate, and when the trench is formed to have a desired depth, a width of the trench may also be increased in proportion to the depth. Therefore, in the capacitor 200 according to another exemplary embodiment in the present disclosure, the first and second trenches 205a and 205b may be formed through a single process by adjusting a width (or diameter) of an exposure region of a mask for forming the first and second trenches 205a and 205b at the time of forming the first and second trenches 205a and 205b.

Figure 12:
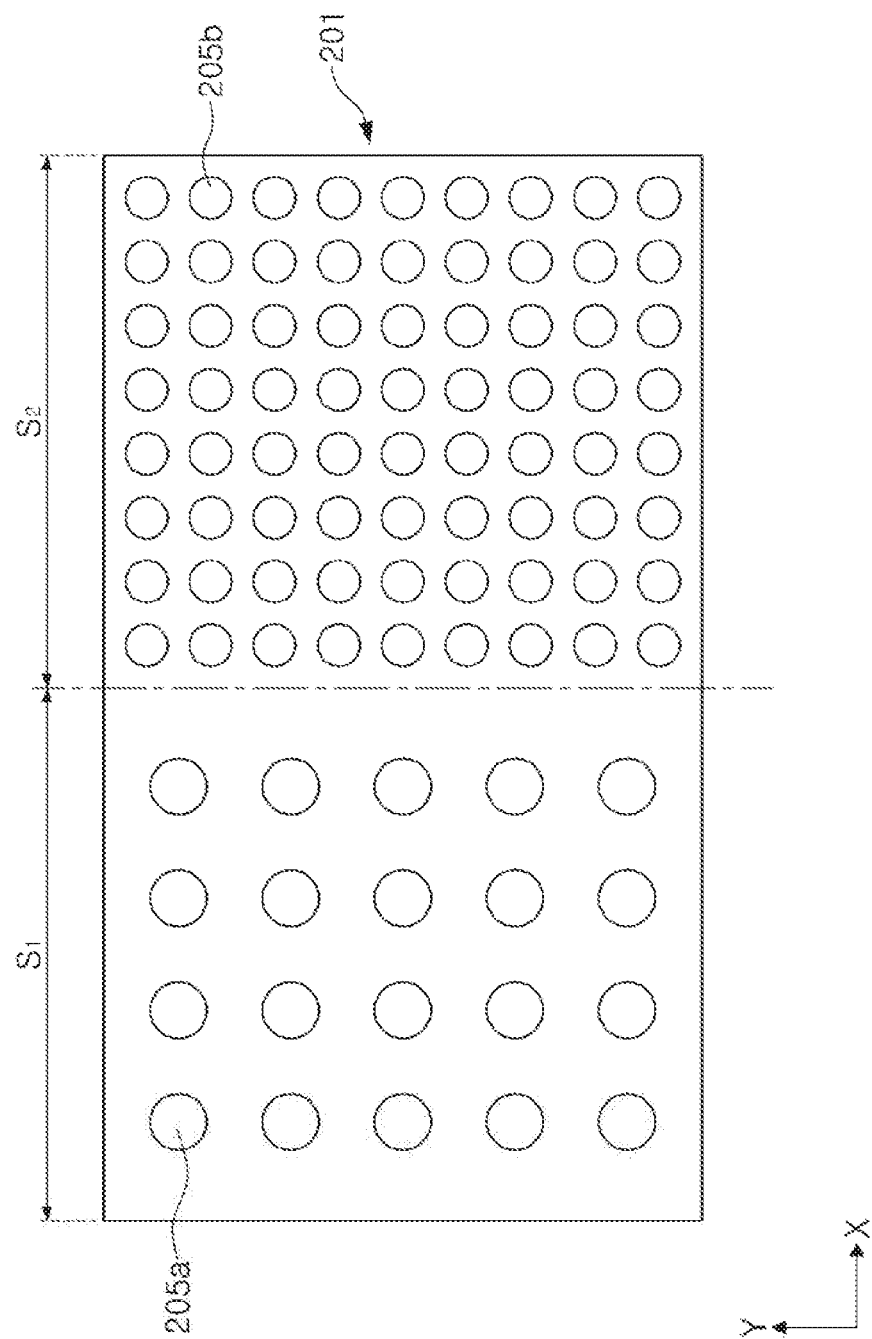
FIGS. 12 through 21 are plan views schematically illustrating various shapes of upper surfaces of first and second trenches according to the present disclosure.
Figure 13:
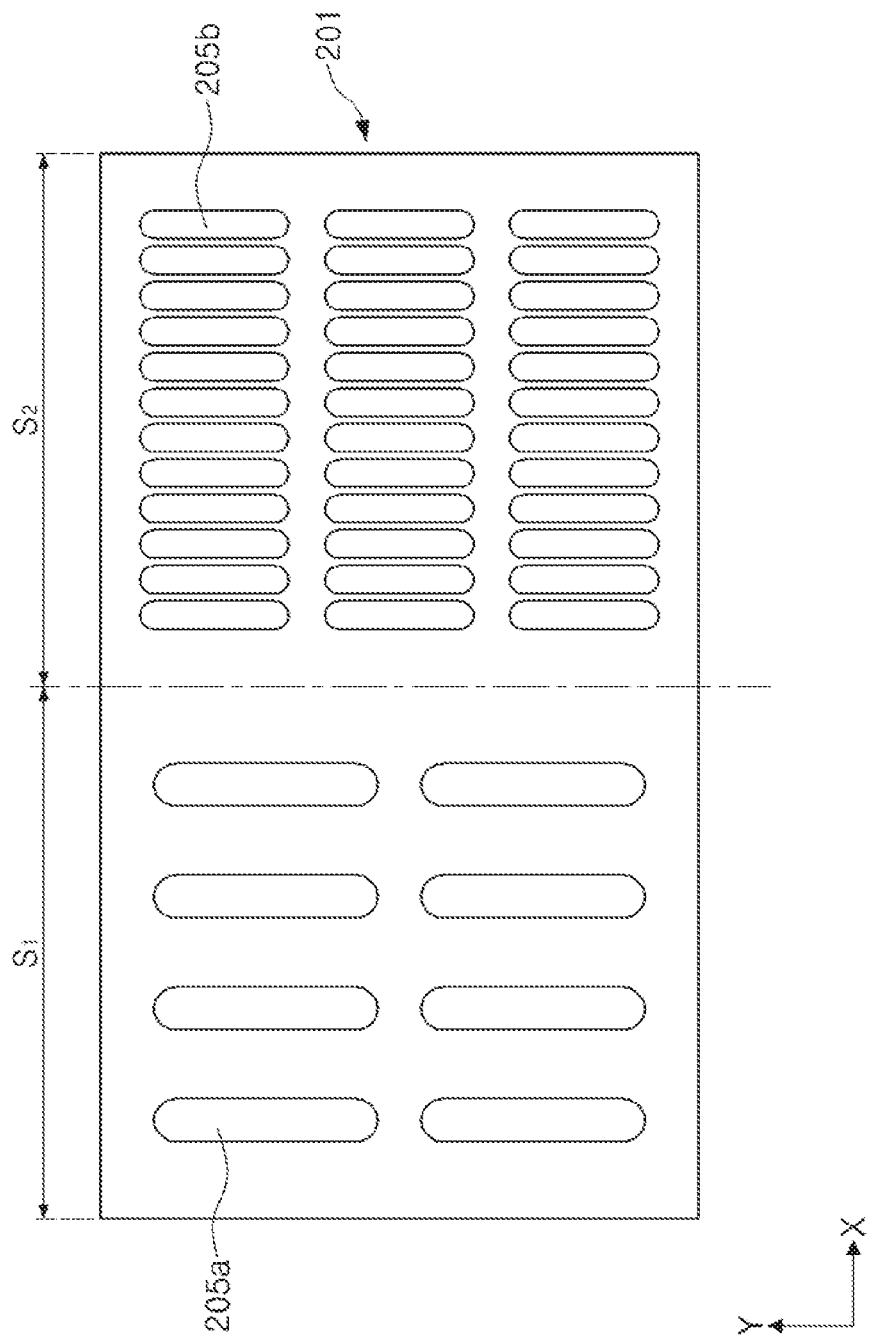
Figure 14:
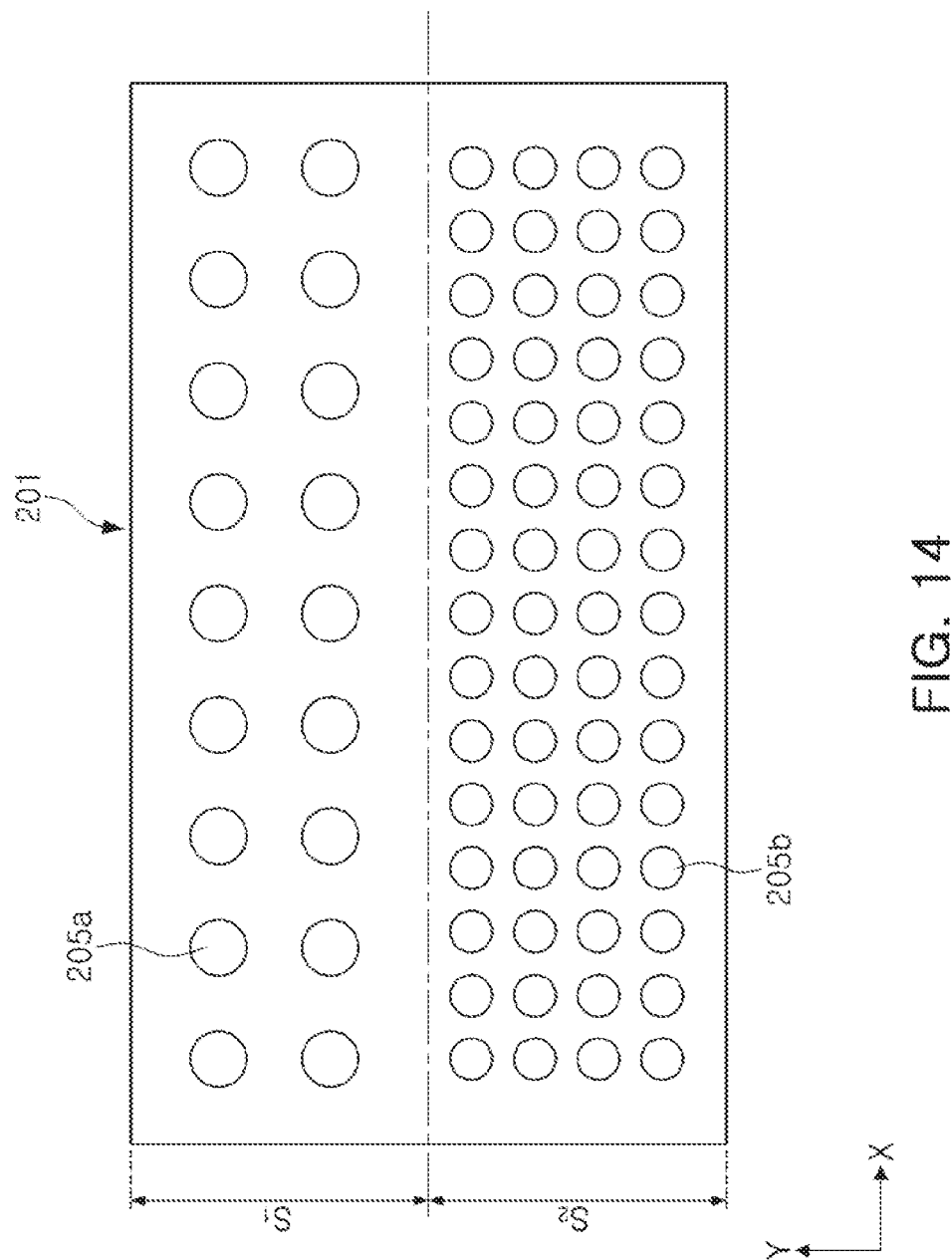
Figure 15:
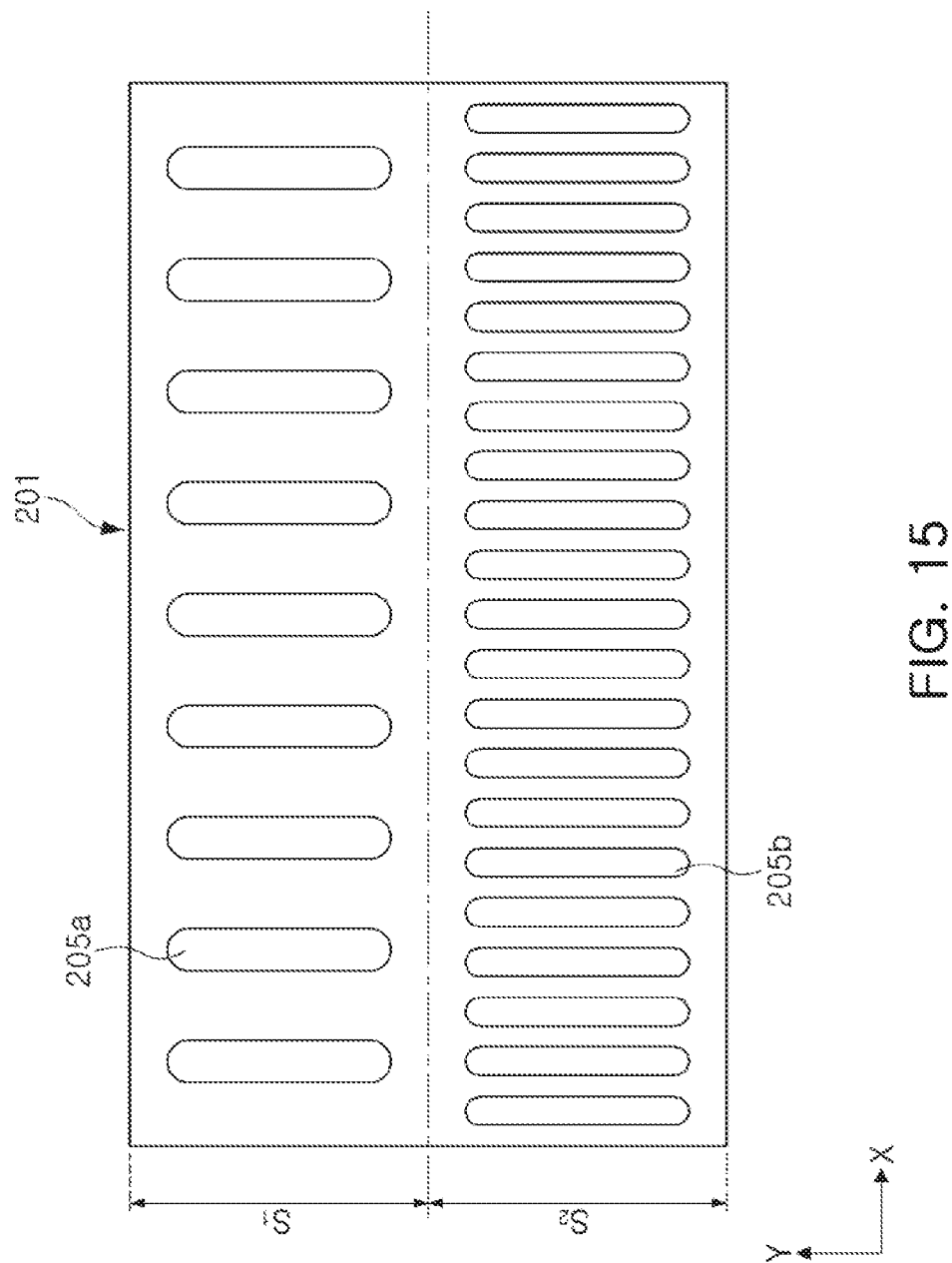

The first and second capacitor regions $S_1$ and $S_2$ may be arranged in a first (X) direction as illustrated in FIGS. 12 and 13. Alternatively, the first and second capacitor regions $S_1$ and $S_2$ may be arranged in a second (Y) direction as illustrated in FIGS. 14 and 15.

Figure 16:
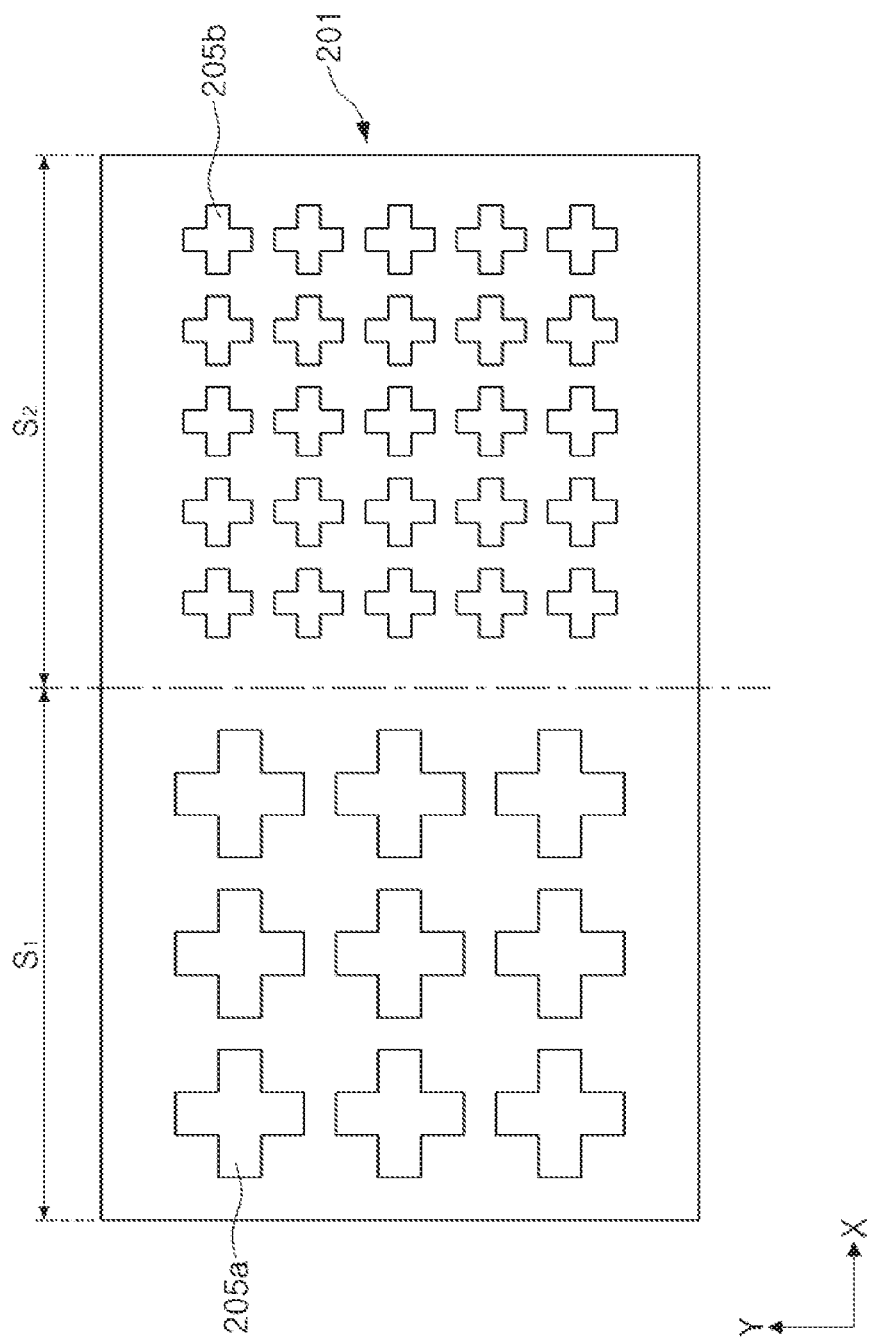
Figure 17:
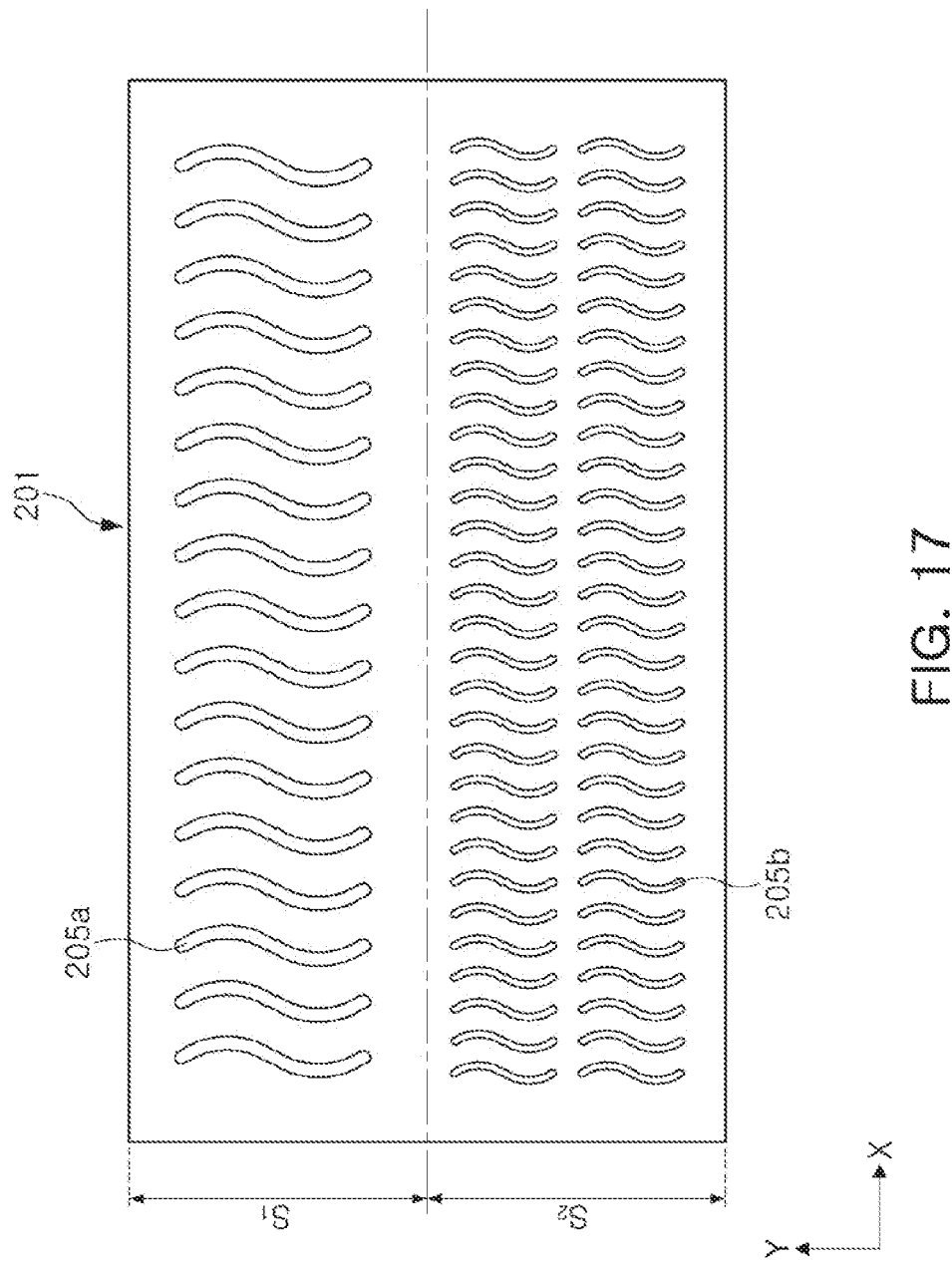

The upper surfaces of the first and second trenches 205a and 205b may have a circular spot shape as illustrated in FIG. 12, a linear groove shape as illustrated in FIG. 13, or a curved groove shape as illustrated in FIG. 17. Unlike this, the upper surfaces of the first and second trenches 205a and 205b may have a cross shape as illustrated in FIG. 16.

As a depth of a trench is increased and the number of trenches per unit area is increased, side walls configuring the trench may be easily broken down by weak force. However, rigidity of the side walls of the trench may be increased by allowing the trench to have a curved groove shape or cross shape.

There is no need to have the shapes of the first and second trenches 205a and 205b in a single capacitor to be the same as each other.

Figure 18:
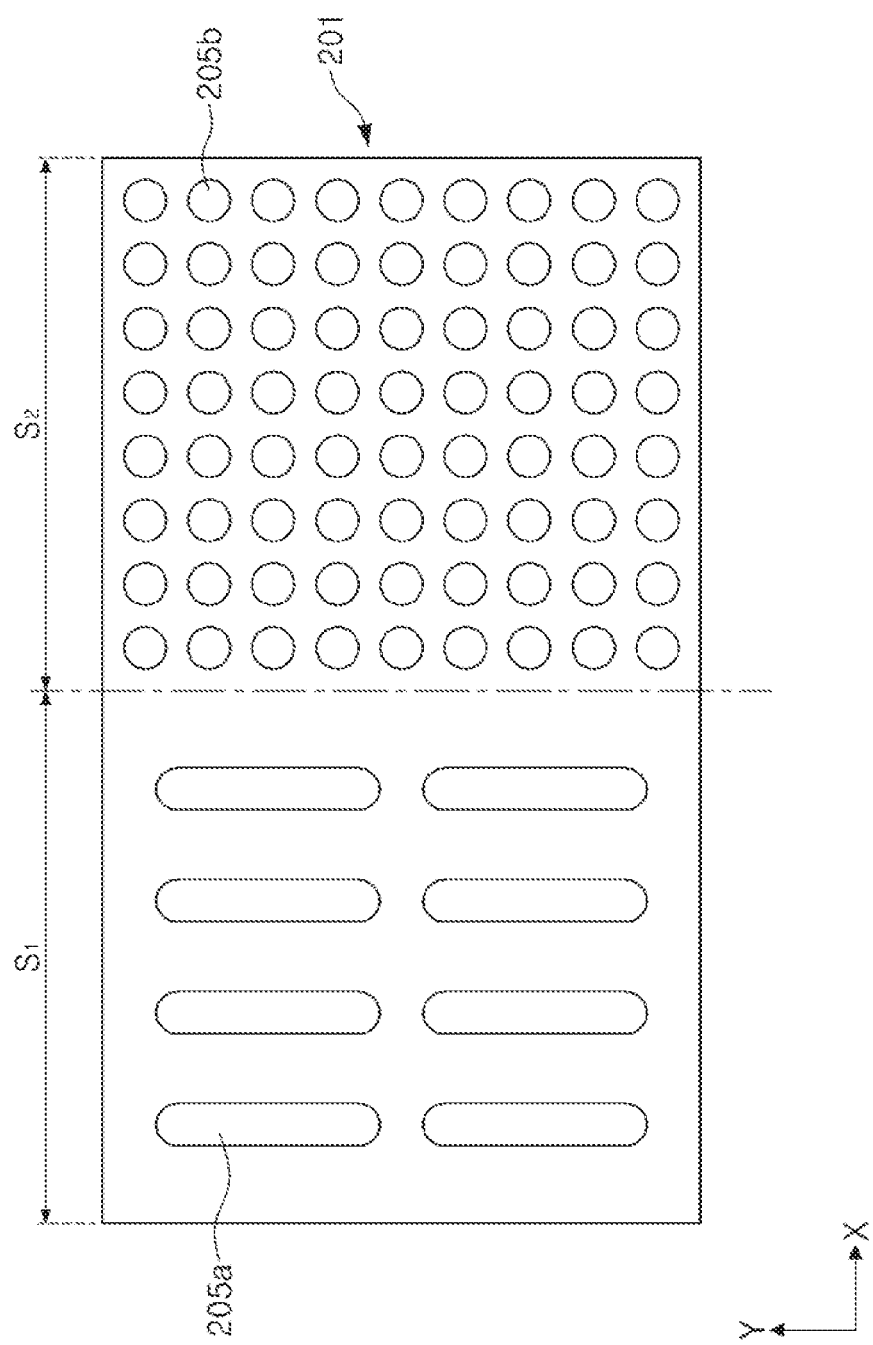

For example, as illustrated in FIG. 18, the first and second capacitor regions $S_1$ and $S_2$ may be arranged in the first (X) direction, the first trench 205a may have a linear groove shape, and the second trench 205b may have a spot shape.

Figure 19:
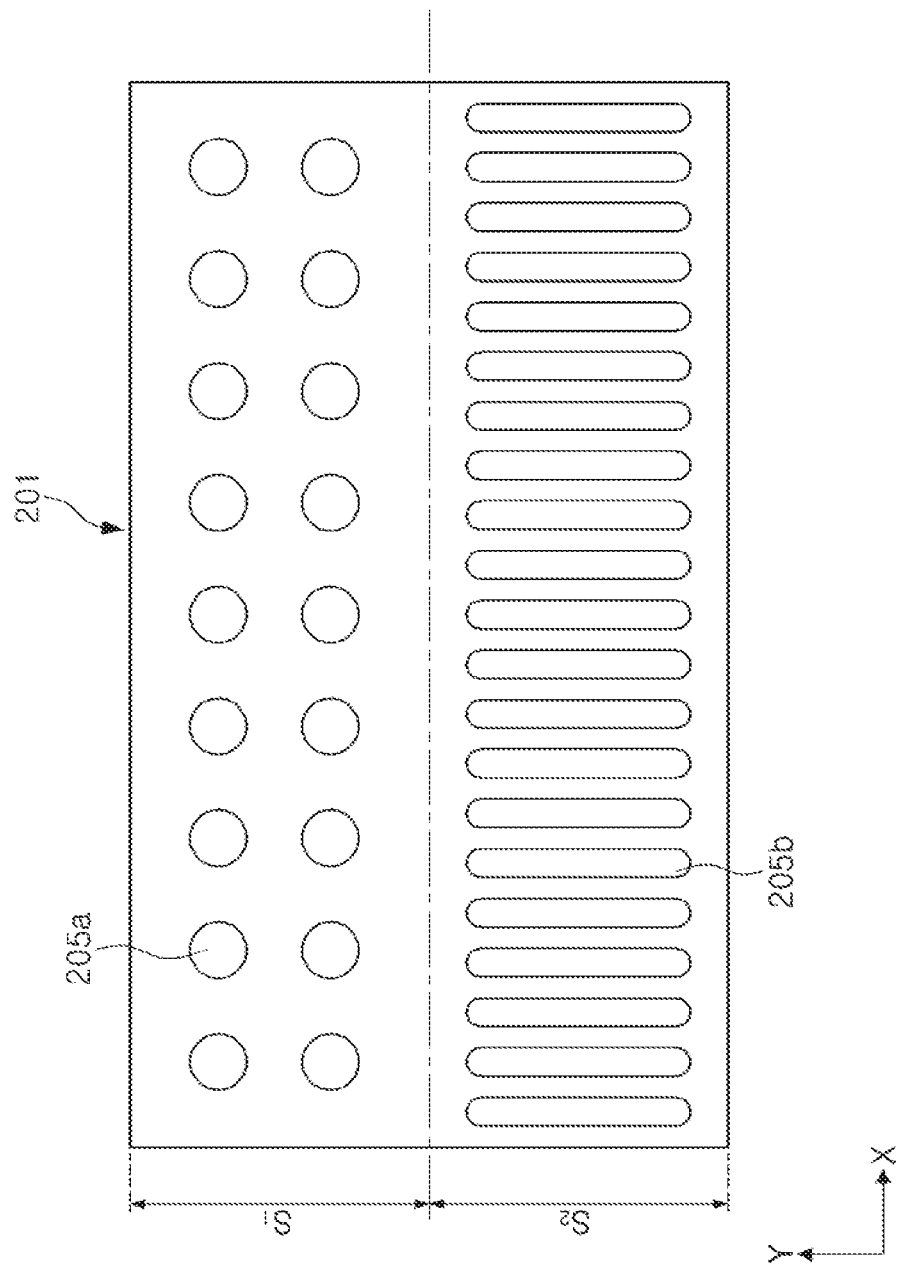

Further, as illustrated in FIG. 19, the first and second capacitor regions $S_1$ and $S_2$ may be arranged in the second (Y) direction, the first trench 205a may have a spot shape, and the second trench 205b may have a linear groove shape.

Further, areas occupied by the first and second capacitor regions $S_1$ and $S_2$ may be equal to each other as described above, but are not limited thereto.

Figure 20:
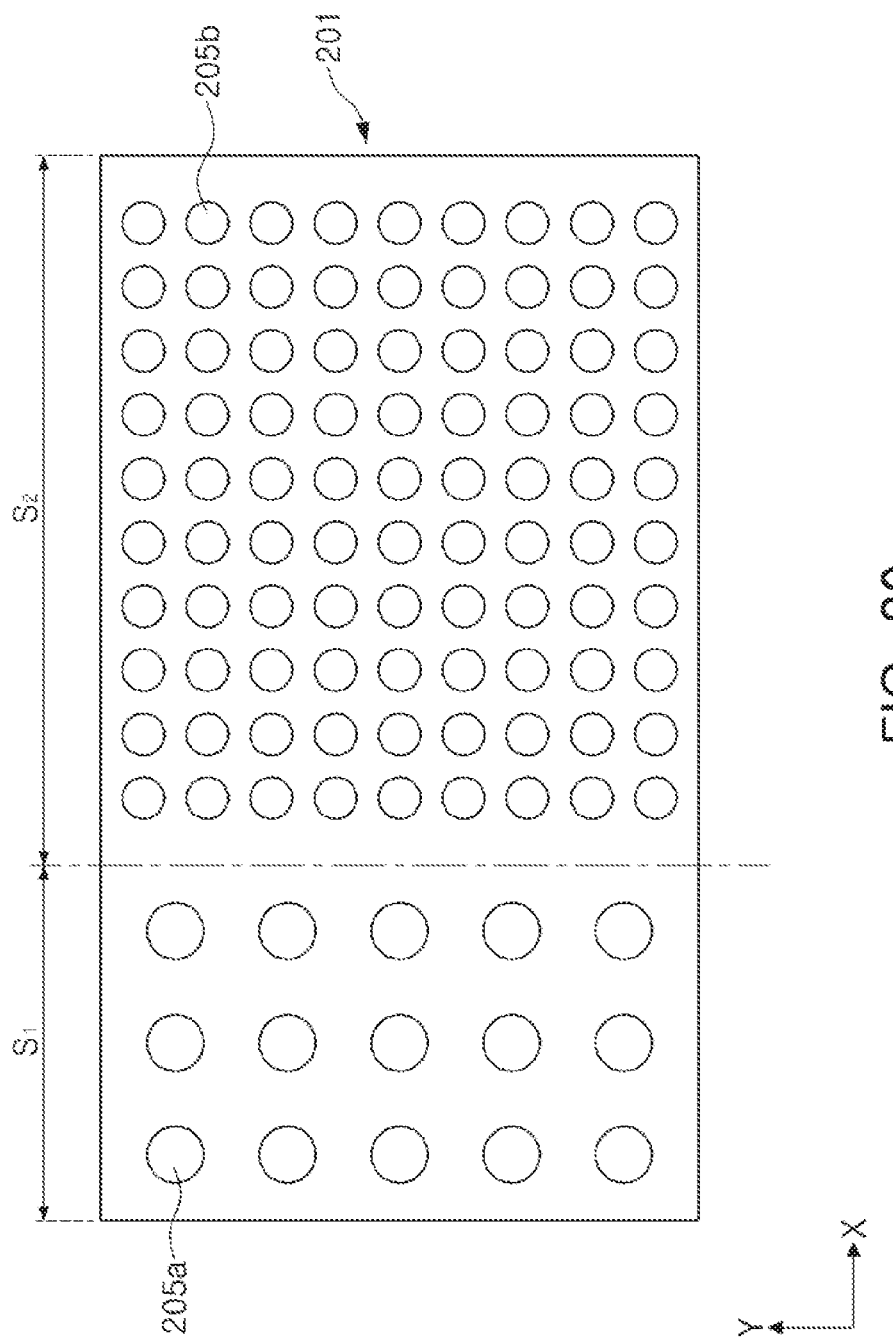
Figure 21:
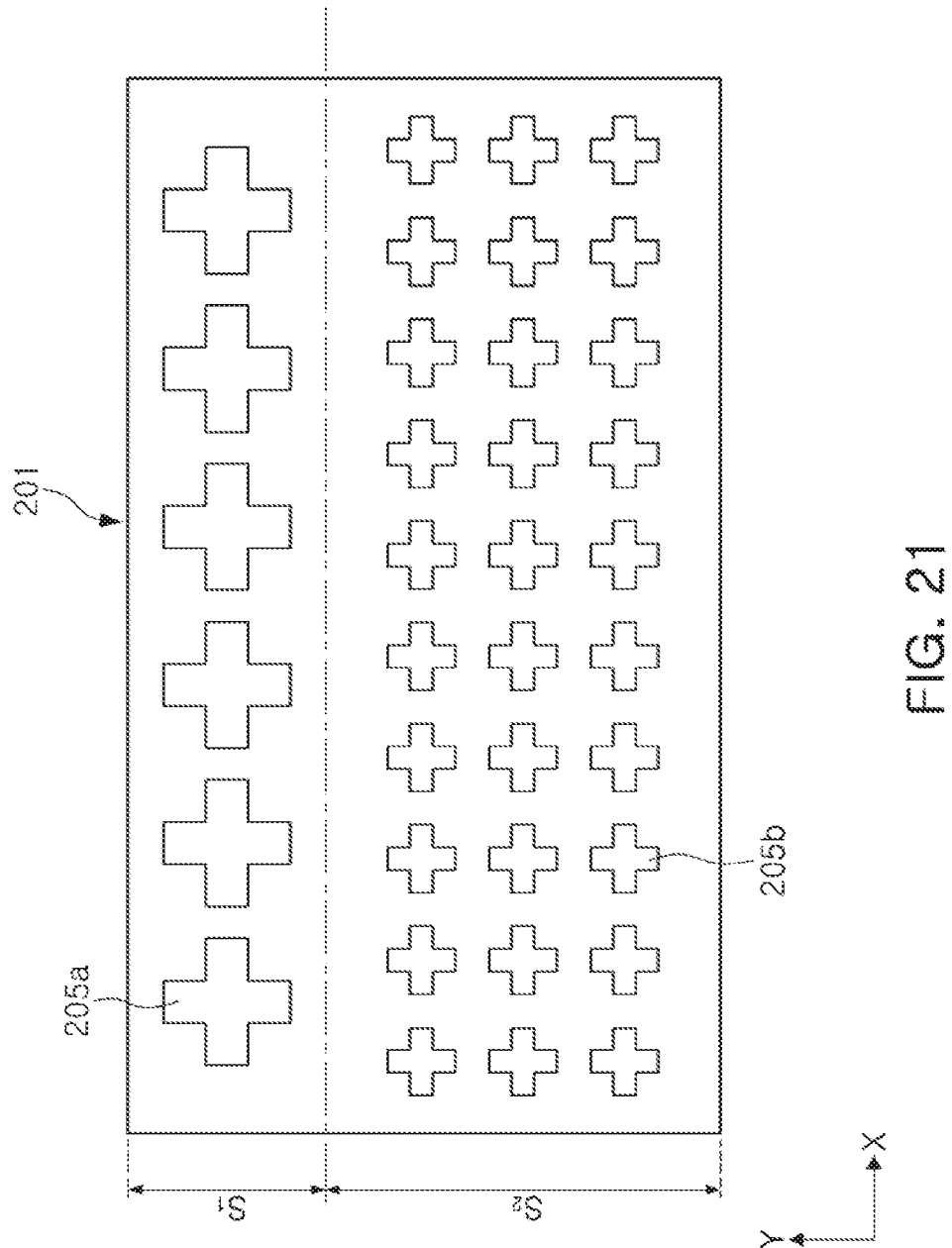

For example, as illustrated in FIG. 20, the first and second capacitor regions $S_1$ and $S_2$ may be arranged in the first (X) direction, and an area occupied by the first capacitor region $S_1$ may be smaller than an area occupied by the second capacitor region $S_2$. Alternatively, as illustrated in FIG. 21, the first and second capacitor regions $S_1$ and $S_2$ may be arranged in the second (Y) direction, and an area occupied by the first capacitor region $S_1$ may be smaller than an area occupied by the second capacitor region $S_2$.

Board Having Capacitor

FIG. 22 is a cross-sectional view schematically illustrating a board having a capacitor according to an embodiment in the present disclosure.

Referring to FIG. 22, a board 1000 having a capacitor according to an embodiment in the present disclosure includes a circuit board 210, a semiconductor chip 220 disposed on one surface of the circuit board 210, and a capacitor 100 disposed on the other surface of the circuit board 210. Those skilled in the art will appreciate that while FIG. 22 shows capacitor 100, capacitor 100' or capacitor 200 may be substituted in the board of FIG. 22.

Here, as the capacitor 100, the capacitor 100 according to an embodiment in the present disclosure may be used. The capacitor 100 according to an embodiment in the present disclosure is a so-called thin-film capacitor. The thin-film capacitor has an advantage in that it has low equivalent series inductance (ESL) unlike a multilayer ceramic capacitor according to the related art, such that application of the thin-film capacitor as a decoupling capacitor for an application processor (AP) has been considered. Particularly, in a case in which the capacitor is used as the decoupling capacitor, there is a need to dispose the capacitor to be adjacent to the AP. Therefore, in the board 1000 having a capacitor according to an embodiment in the present disclosure, the semiconductor chip 220 used as the AP may be disposed on one surface of the circuit board 210, and the capacitor 100 may be disposed at a position opposite to the semiconductor chip 220 on the other surface of the circuit board 210.

The capacitor 100 disposed in the position opposite to the semiconductor chip 220 as described above is also referred to as a land-side capacitor (LSC). Since the land-side capacitor (LSC) type capacitor 100 as described above is disposed on the other surface of the circuit board 210 in the position opposite to the semiconductor chip 220, in order to mount the circuit board 210 on a main board 310, there is a need to allow the capacitor to have a thickness thinner than that of solder balls 230 and to significantly decrease an area required to mount the capacitor 100 by designing the capacitor to be as small as possible.

Since the board 1000 having a capacitor according to an embodiment in the present disclosure uses the capacitors according to various exemplary embodiments in the present disclosure described above, the board 1000 having a capacitor may have capacitance flexibility while having high capacitance of the capacitor even in a small area.

As set forth above, according to exemplary embodiments in the present disclosure, a multilayer thin film capacitor having capacitance flexibility while significantly increasing capacitance of the capacitor in a case of having the same number of electrode layers and the same number of dielectric layers in the same chip size may be provided.

While exemplary embodiments have been shown and described above, it will be apparent to those skilled in the art that modifications and variations could be made without departing from the scope of the present invention as defined by the appended claims.

What is claimed is:

1. A capacitor comprising:
   a body including a substrate having first and second capacitor regions; and
   first to third terminal electrodes disposed on an external surface of the body,
   wherein the first capacitor region includes
      a plurality of first trenches; and
      a first capacitor layer disposed on one surface of the substrate and in the first trenches, the first capacitor layer including at least one first dielectric layer, and first and second electrodes disposed with the at least one first dielectric layer interposed therebetween,
   the second capacitor region includes
      a plurality of second trenches; and
      a second capacitor layer disposed on one surface of the substrate and the second trenches, the second capacitor layer including at least one second dielectric layer and third and fourth electrodes disposed with the at least one second dielectric layer interposed therebetween, and
   the second capacitor layer has a specific surface area greater than that of the first capacitor layer.

2. The capacitor of claim 1, wherein the number of first trenches per unit area is smaller than the number of second trenches per unit area.

3. The capacitor of claim 1, wherein a width of the first trench is greater than that of the second trench or a depth of the first trench is deeper than that of the second trench.

4. The capacitor of claim 1, wherein upper portions of the first and second trenches are at least one of a linear groove shape formed to be elongated in one direction, a curved groove shape, a spot shape, and a cross shape.

5. The capacitor of claim 1, wherein the first and second capacitor regions are arranged in a first direction of the body or a second direction of the body perpendicular to the first direction of the body.

6. The capacitor of claim 1, wherein an area of the first capacitor region is smaller than that of the second capacitor region.

7. The capacitor of claim 1, wherein among the first to fourth electrodes, an electrode disposed on a lowermost layer is a doped layer formed by injecting n-type impurities into the substrate.

8. The capacitor of claim 1, wherein each of the first to fourth electrodes is connected to one of the first to third terminal electrodes by first and second connection electrodes.

9. The capacitor of claim 1, wherein the first capacitor layer includes first and second lead portions declined outwardly from the first capacitor layer and composed of the first electrode, the first dielectric layer, and the second electrode in a step shape, and the second capacitor layer includes third and fourth lead portions declined outwardly from the second capacitor layer and composed of the third electrode, the second dielectric layer, and the fourth electrode in a step shape.

10. The capacitor of claim 9, wherein an insulating layer is disposed on the first to fourth lead portions, the first and third lead portions include first openings to which the first and third electrodes are exposed in the insulating layer, respectively, the second and fourth lead portions include second openings to which the second and fourth electrodes are exposed in the insulating layer, and a conductive layer connected to one of the first to third terminal electrodes is disposed on the first and second openings and the insulating layer.

11. A board having a capacitor, the board comprising:

a circuit board having a first surface on which a semiconductor chip is disposed; and the capacitor of claim 1, disposed on a second surface of the circuit board, corresponding to a mounting surface.

* * * * *